(12) United States Patent
Chang et al.

(10) Patent No.: US 12,278,147 B2
(45) Date of Patent: Apr. 15, 2025

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Tun-Jen Chang, Hsinchu (TW); Tung-Heng Hsieh, Zhudong Town (TW); Bao-Ru Young, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 396 days.

(21) Appl. No.: 17/745,578

(22) Filed: May 16, 2022

(65) Prior Publication Data

US 2023/0369127 A1 Nov. 16, 2023

(51) Int. Cl.
*H01L 21/8234* (2006.01)
*H01L 27/088* (2006.01)
*H01L 29/417* (2006.01)

(52) U.S. Cl.
CPC ......... *H01L 21/823475* (2013.01); *H01L 21/823431* (2013.01); *H01L 27/0886* (2013.01); *H01L 29/41791* (2013.01)

(58) Field of Classification Search
CPC ..... H01L 21/823475; H01L 21/823431; H01L 27/0886; H01L 29/41791; H01L 21/823481
USPC ...................................................... 257/382
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,276,116 B2* | 3/2016 | Maeda | H01L 29/785 |
| 9,520,482 B1 | 12/2016 | Chang et al. | |
| 9,576,814 B2 | 2/2017 | Wu et al. | |
| 9,595,611 B2* | 3/2017 | Kim | H01L 27/1211 |
| 9,761,719 B2* | 9/2017 | Kim | H01L 29/0847 |
| 10,586,765 B2* | 3/2020 | Smith | H01L 21/76802 |

(Continued)

*Primary Examiner* — Vu A Vu
(74) *Attorney, Agent, or Firm* — Birch, Stewart, Kolasch & Birch, LLP

(57) ABSTRACT

A method includes forming a fin structure over a substrate, forming a first source/drain feature and a second source/drain feature over the fin structure, forming a dielectric material over the first source/drain feature and the second source/drain feature, patterning the dielectric layer into insulating features, and forming a first contact plug on the first source/drain feature and a second contact plug on the second source/drain feature. The insulating features include a first insulating feature and a second insulating feature on opposite sides of the first source/drain feature, and a third insulating feature and a fourth insulating feature on opposite sides of the second source/drain feature. The first insulating feature is longer than the third insulating feature. The distance between the first and second insulating features is greater than the distance between the third and fourth insulating features.

20 Claims, 12 Drawing Sheets

(56) References Cited

U.S. PATENT DOCUMENTS

| | | | |
|---|---|---|---|
| 10,686,073 B2* | 6/2020 | Paak | H01L 29/7845 |
| 10,700,203 B2* | 6/2020 | Kim | H01L 27/0886 |
| 10,727,234 B2* | 7/2020 | Zhou | H01L 27/092 |
| 10,770,288 B2* | 9/2020 | Chi | H01L 29/41791 |
| 2016/0005822 A1* | 1/2016 | Song | H01L 29/7834 |
| | | | 257/288 |
| 2020/0161439 A1* | 5/2020 | You | H01L 29/41791 |
| 2021/0098598 A1* | 4/2021 | Yang | H01L 21/31144 |
| 2023/0352591 A1* | 11/2023 | Bae | H01L 29/41766 |

* cited by examiner

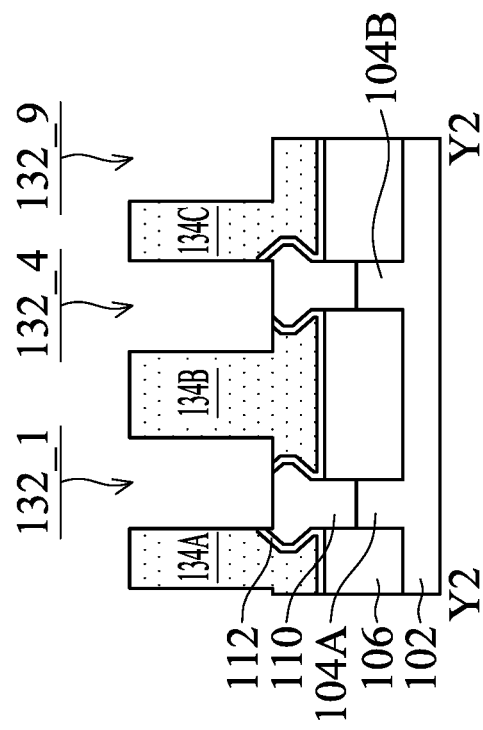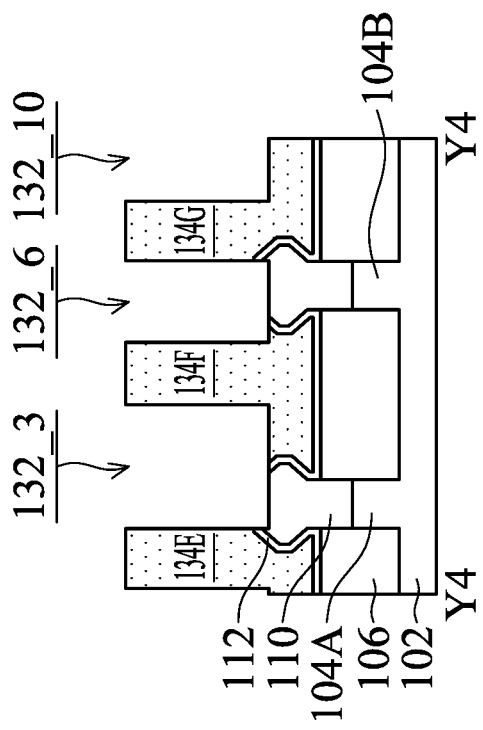
FIG. 2C-2
FIG. 2C-4
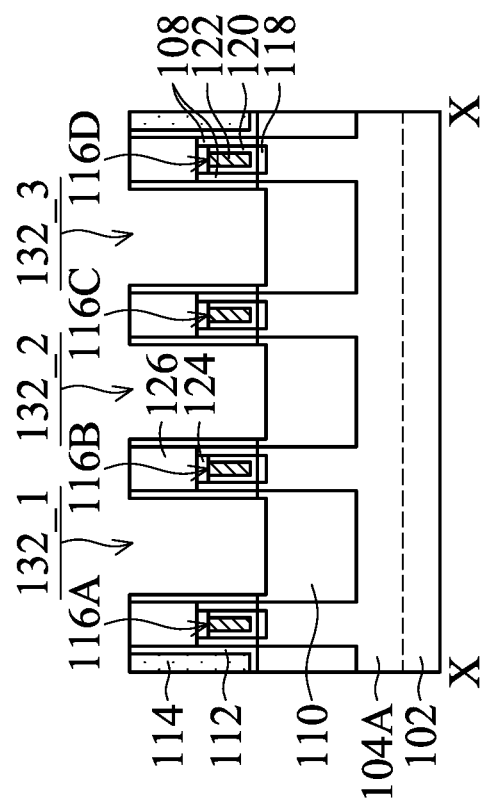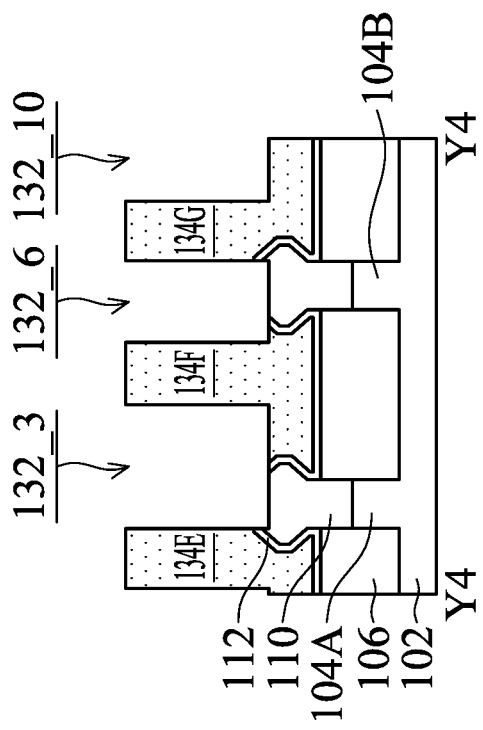
FIG. 2C-1
FIG. 2C-3

SEMICONDUCTOR STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2B-1, 2C-1, 2D-1 and 2E-1 are cross-sectional views taken along line X-X shown in FIGS. 2A, 2B, 2C, 2D and 2E, in accordance with some embodiments of the disclosure.

FIGS. 2A-2 is a cross-sectional view taken along line Y1-Y1, in accordance with some embodiments of the disclosure.

FIGS. 2A-3, 2B-2, 2C-2, 2D-2 and 2E-2 are cross-sectional views taken along line Y2-Y2 shown in FIGS. 2A, 2B, 2C, 2D and 2E, in accordance with some embodiments of the disclosure.

FIGS. 2B-3, 2C-3, 2D-3 and 2E-3 are cross-sectional views taken along line Y3-Y3 shown in FIGS. 2B, 2C, 2D and 2E, in accordance with some embodiments of the disclosure.

FIGS. 2B-4, 2C-4, 2D-4 and 2E-4 are cross-sectional views taken along line Y4-Y4 shown in FIGS. 2B, 2C, 2D and 2E, in accordance with some embodiments of the disclosure.

FIGS. 3-1, 3-2 and 3-3 are a modification of FIGS. 2E-2, 2E-3 and 2E-4, in accordance with some embodiments.

DETAILED DESCRIPTION

Figure 1:
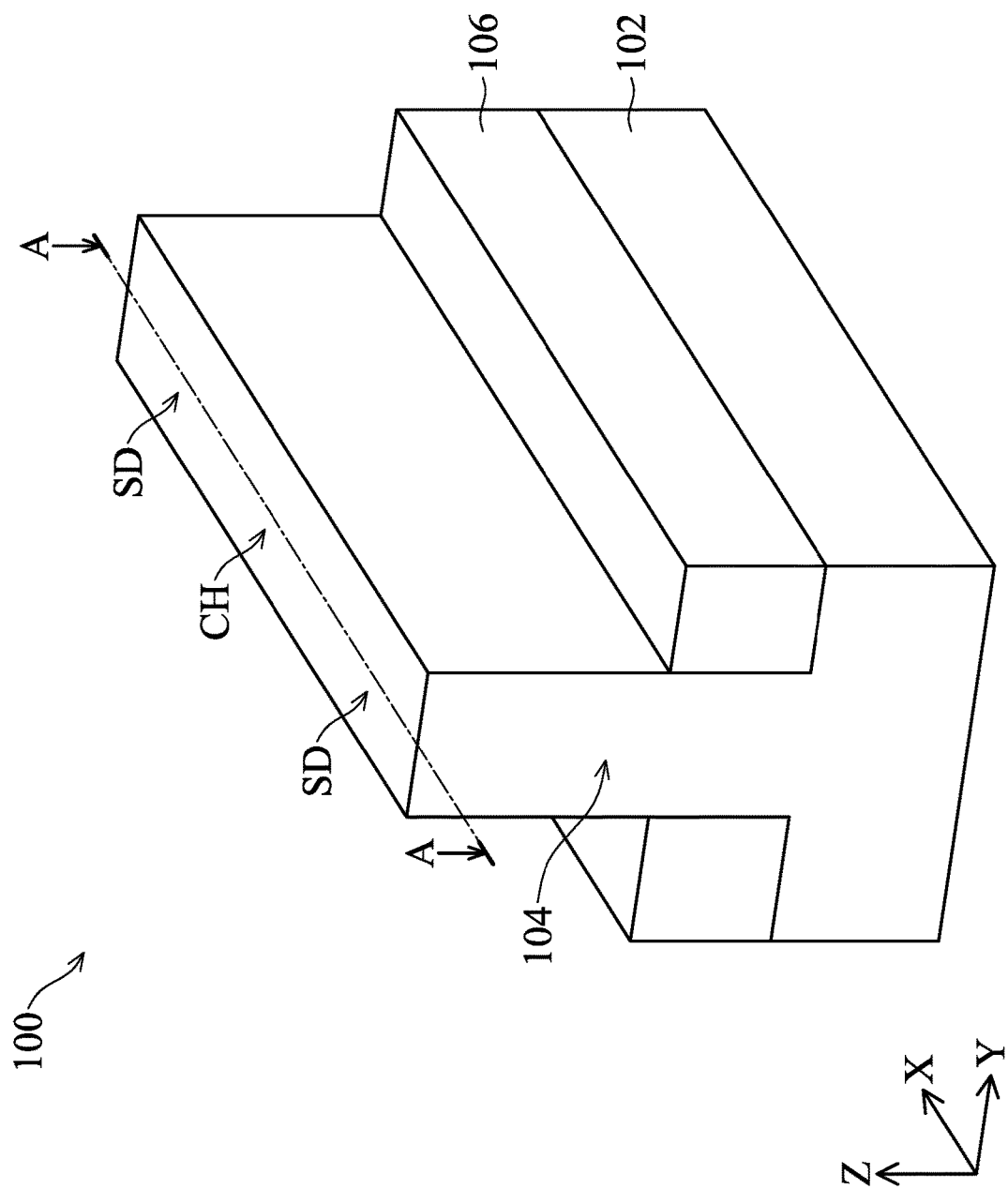
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of a semiconductor structure and a method for forming the same are provided. The aspect of the present disclosure is directed a configuration of CMD features which is used to isolate contact plugs from one another. The embodiments provide three dimensions W1, W2 and W3 (W1<W2<W3) for the insulating features and three distances S1, S2 and S2 (S1<S2<S3) between them. The minimum distance between the insulating feature having the second dimension W2 and the insulating feature having the first dimension W1 may be the second distance S2. The risk of an open circuit being caused by the contact plug formed between the insulating features not extending to the source/drain feature may be significantly reduced. Furthermore, the parasitic capacitance between a final gate stack and the contact plug may not significantly increase. Therefore, a good balance between performance and the manufacturing yield of the resulting semiconductor device may be achieved.

FIG. 1 is a perspective view of a semiconductor structure 100, in accordance with some embodiments. The semiconductor structure 100 includes a substrate 102, and a fin structure 104 and an isolation structure 106 over the substrate 102, in accordance with some embodiments. Although one fin structure 104 is illustrated in FIG. 1, more than one fin structure 104 may be formed over the semiconductor structure 100.

For a better understanding of the semiconductor structure, X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The fin structure 104 extends in the X direction, in accordance with some embodiments. That is, the fin structure has a longitudinal axis parallel to the X direction, in accordance with some embodiments. The X direction may also be referred to as the channel-extending direction. The current of the resulting semiconductor device (i.e., FinFET) flows in the X direction through the channel.

The fin structure 104 includes a channel region CH and source/drain regions SD, where the channel region CH is defined between the source/drain regions SD, in accordance with some embodiments. In this disclosure, a source/drain refers to a source and/or a drain. It should be noted that in the present disclosure, a source and a drain are used interchangeably and the structures thereof are substantially the same. FIG. 1 shows one channel region CH and two source/drain regions SD for illustrative purposes and is not intended to be limiting. The number of channel regions CH and source/drain regions may be dependent on the demands on the design of the semiconductor device and/or performance considerations. A gate structure or gate stack (not shown) will be formed with a longitudinal axis parallel to the Y direction and extending across and/or surrounding the channel region CH of the fin structure 104. The Y direction may also be referred to as a gate-extending direction.

Figure 2A:
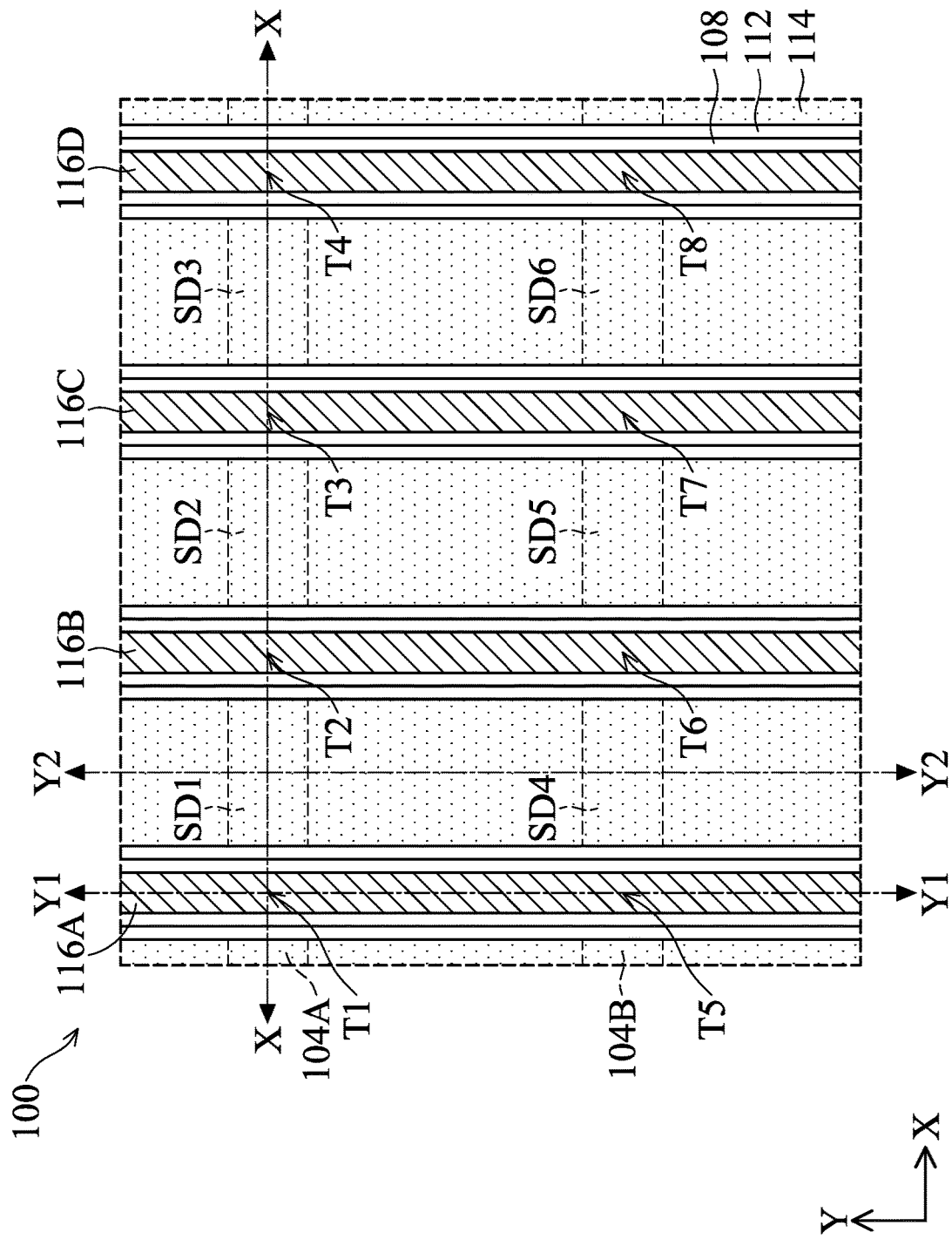
FIGS. 2A, 2B, 2C, 2D and 2E are plan views illustrating the formation of a semiconductor structure at various intermediate stages, in accordance with some embodiments of the disclosure.

FIGS. 2A to 2E-4 are diagrammatic views illustrating the formation of a semiconductor structure 100 at various intermediate stages, in accordance with some embodiments of the disclosure. FIG. 2A is a plan view of a semiconductor structure 100 after the formation of transistors T1-T8, in accordance with some embodiments. FIGS. 2A-1, 2A-2 and 2A-3 are cross-sectional views taken along line X-X, line Y1-Y1 and Y2-Y2 shown in FIG. 2A, respectively. It should be noted that the plan views in the present disclosure only illustrate some components of the semiconductor structure 100 for illustrative purpose, some other components of the semiconductor structure 100 may be shown in the cross-sectional views.

FIG. 2A illustrates a semiconductor structure 100 which may be a portion of a FinFET device, in accordance with some embodiments. A substrate 102 is provided, and fin structures 104 (including 104A and 104B) and an isolation structure 106 are formed over the substrate 102, as shown in FIGS. 2A, 2A-1, 2A-2 and 2A-3, in accordance with some embodiments.

In some embodiments, the substrate 102 is a semiconductor substrate such as a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The formation of the fin structures 104A and 104B includes patterning substrate 102 thereby forming trenches and the fin structures 104A and 104B protruding from between the trenches, in accordance with some embodiments. The patterning may include photolithography and etching process. In some embodiments, the fin structures 104A and 104B extend in the X direction. That is, the fin structures 104A and 104B have longitudinal axes parallel to the X direction, in accordance with some embodiments.

An insulating material for the isolation structure 106 is formed to overfill the trenches, in accordance with some embodiments. The insulating material is formed over the upper surfaces of the fin structures 104A and 104B, in accordance with some embodiments. In some embodiments, the insulating material includes silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, the insulating material is deposited using chemical vapor deposition (CVD) (such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, and/or a combination thereof.

The insulating material over the upper surfaces of the fin structures 104A and 104B is planarized to expose the upper surfaces of the fin structures 104A and 104B, for example, using chemical mechanical polishing (CMP), etching back process, or a combination thereof, in accordance with some embodiments. The insulating material is further recessed to expose upper portions of the sidewalls of the fin structures 104A and 104B, in accordance with some embodiments. A remainder of the insulating material serves as the isolation structure 106, in accordance with some embodiments. The isolation structure 106 surrounds lower portions of the fin structures 104A and 104B, in accordance with some embodiments.

In some embodiments, the semiconductor structure 100 is formed using a gate-late process. For example, four dummy gate structures (not shown) may be formed across the fin structures 104A and 104B in the place where final gate stacks 116 are to be formed. In some embodiments, the dummy gate structures extend in the Y direction. The dummy gate structures surround the channel regions of the fin structures 104A and 104B to define the channel regions and the source/drain regions SD, in accordance with some embodiments.

The fin structure 104A includes a source/drain region SD1 between the final gate stacks 116A and 116B, a source/drain region SD2 between the final gate stacks 116B and 116C, and a source/drain region SD3 between the final gate stacks 116C and 116D, in accordance with some embodiments. The fin structure 104B includes a source/drain region SD4 between the final gate stacks 116A and 116B, a source/drain region SD5 between the final gate stacks 116B and 116C, and a source/drain region SD6 between the final gate stacks 116C and 116D, in accordance with some embodiments.

The dummy gate structures are configured as sacrificial structures and are replaced with the final gate stacks 116A, 116B, 116C and 116D, in accordance with some embodiments. Each of the dummy gate structures includes a dummy gate dielectric layer and a dummy gate electrode layer over the dummy gate dielectric layer, in accordance with some embodiments. In some embodiments, the dummy gate dielectric layer is formed along the upper portions of the fin structures 104A and 104B, in accordance with some embodiments. In some embodiments, the dummy gate dielectric layer is made of one or more dielectric materials, such as silicon oxide (SiO), silicon nitride (SiN), silicon oxynitride (SiON), $HfO_2$, HfZrO, HfSiO, HfTiO, HfAlO. In some embodiments, the dielectric material is formed using ALD, CVD, thermal oxidation, physical vapor deposition (PVD), another suitable technique, and/or a combination thereof.

In some embodiments, the dummy gate electrode layer is made of semiconductor material such as polysilicon, polysilicon germanium. In some embodiments, the material for the dummy gate electrode layer is formed using CVD, another suitable technique, and/or a combination thereof. Afterward, the materials for the dummy gate electrode layer and the dummy gate dielectric layer are patterned into the dummy gate structures, in accordance with some embodiments. In some embodiments, the patterning process includes photolithography and etching processes.

Gate spacer layers 108 are formed over the substrate 102, as shown in FIGS. 2A and 2A-1, in accordance with some embodiments. The gate spacer layers 108 extend along and covers opposite sides of the dummy gate structures, in accordance with some embodiments. In some embodiments, the gate spacer layers 108 are made of a dielectric material, such as silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof, and/or a combination thereof.

In some embodiments, the formation of the gate spacer layers 108 includes conformally depositing dielectric materials for the gate spacer layer 108 over the semiconductor structure 100 followed by an anisotropic etching process (such as dry plasma etching). Vertical portions of the dielectric material remain on the sidewalls of the dummy gate structures to serve as the gate spacer layers 108, in accordance with some embodiments.

Source/drain features 110 are formed over the source/drain regions SD1-SD6 of the fin structures 104A and 104B, as shown in FIGS. 2A-1 and 2A-3, in accordance with some embodiments. The formation of the source/drain features 110 includes recessing the source/drain region SD of the fin structures 104A and 104B using the dummy gate structures and the gate spacer layers 112 as masks to form source/drain recesses on opposite sides of the dummy gate structures, in accordance with some embodiments.

Afterward, the source/drain features 110 are grown on the lower portions of the fin structures 104A and 104B in the source/drain recesses using an epitaxial growth process, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the source/drain features 110 are made of any suitable material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 110 are in-situ doped during the epitaxial growth process. For example, the source/drain features 110 may be the epitaxially grown SiGe doped with boron (B). For example, the source/drain features 110 may be the epitaxially grown Si doped with carbon to form silicon:carbon (Si:C) source/drain features, phosphorous to form silicon: phosphor (Si:P) source/drain features, or both carbon and phosphorous to form silicon carbon phosphor (SiCP) source/drain features.

Figures 2, 2A:
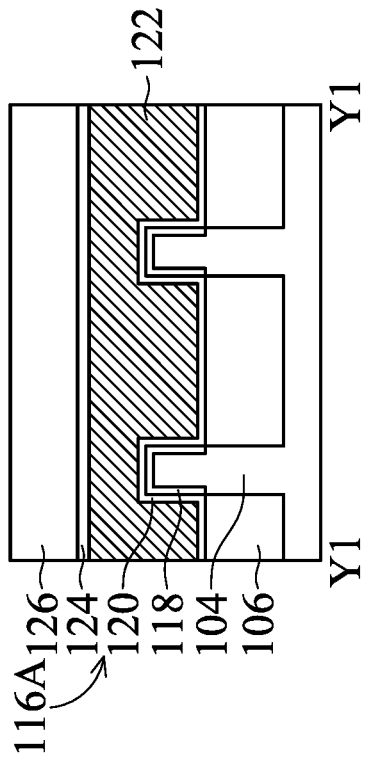
Figures 1, 2A:
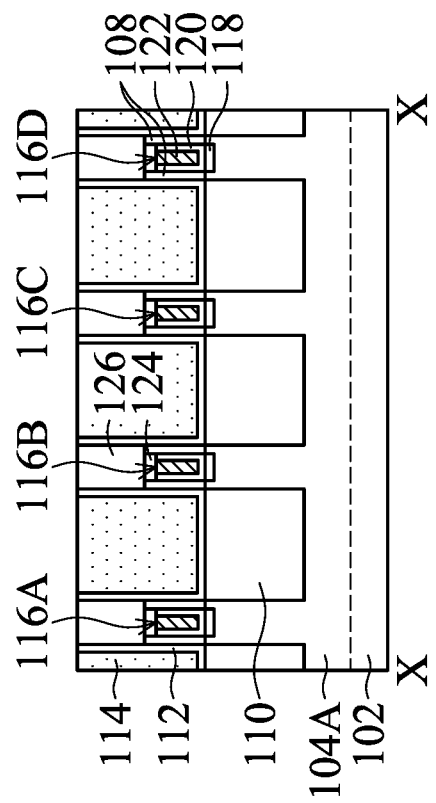

A contact etching stop layer (CESL) 112 is formed over the semiconductor structure 100 to cover the source/drain features 110, as shown in FIGS. 2A, 2A-1 and 2A-2, in accordance with some embodiments. In some embodiments, the contact etching stop layer 112 is made of dielectric material, such as silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, a dielectric material for the contact etching stop layer 112 is globally and conformally deposited using CVD (such as LPCVD, PECVD, HDP-CVD, or HARP), ALD, another suitable method, or a combination thereof.

A lower (or first) interlayer dielectric (ILD) layer 114 over the contact etching stop layer 112, as shown in FIGS. 2A-1 and 2A-3, in accordance with some embodiments. The lower interlayer dielectric layer 114 fills the spaces between the dummy gate structures, in accordance with some embodiments. In some embodiments, the lower interlayer dielectric layer 114 is made of dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material.

In some embodiments, the lower interlayer dielectric layer 114 and the contact etching stop layer 112 are made of different materials and have a great difference in etching selectivity. The term "etching stop layer" used herein refers to a layer that may provide a mechanism to stop or slow down an etching process when forming, e.g., openings, holes, trenches, etc.

In some embodiments, the dielectric material for the lower interlayer dielectric layer 114 is deposited using such as CVD (such as HDP-CVD, PECVD, HARP or FCVD), another suitable technique, and/or a combination thereof. The dielectric materials for the contact etching stop layer 112 and the lower interlayer dielectric layer 114 above the upper surface of the dummy gate structures are removed using such as CMP, in accordance with some embodiments.

The dummy gate structures are removed using an etching process to form gate trenches, in accordance with some embodiments. The gate trenches expose the channel regions of the fin structures 104A and 104B, in accordance with some embodiments. In some embodiments, the gate trenches also expose the inner sidewalls of the gate spacer layers 112 facing the channel region, in accordance with some embodiments. The etching process may be an anisotropic etching process such as dry plasma etching, an isotropic etching process such as dry chemical etching, remote plasma etching or wet chemical etching, and/or a combination thereof.

Final gate stacks 116 (including 116A, 116B, 116C and 116D) are formed over the channel region of the fin structures 104A and 104B in the gate trenches, as shown in FIGS. 2A, 2A-1 and 2A-2, in accordance with some embodiments. In some embodiments, the final gate stacks 116A-116D extend in the Y direction. That is, the final gate stacks 116A-116D have longitudinal axes parallel to the Y direction, in accordance with some embodiments. In some embodiments, the final gate stacks 116A-116D extend across and surround the channel regions of the fin structures 104A and 104B, in accordance with some embodiments. The final gate stacks 116A, 116B, 116C and 116D engage the channel region so that current can flow between the source/drain regions during operation.

In some embodiments, each of the final gate stacks 116A-116D includes an interfacial layer 118, a gate dielectric layer 120 over the interfacial layer 118, and gate electrode layer 122 formed over the gate dielectric layer 120, as shown in FIGS. 2A-1 and 2A-2, in accordance with some embodiments.

The interfacial layer 118 may be made of a chemically formed silicon oxide by one or more cleaning processes such as including ozone ($O_3$), ammonia hydroxide-hydrogen peroxide-water mixture, and/or hydrochloric acid-hydrogen peroxide-water mixture. The interfacial layer 118 may be formed by oxidizing outer portions of the fin structures 104A and 104B.

The gate dielectric layer 120 is formed to partially fill the gate trenches, in accordance with some embodiments. The gate dielectric layer 120 may be high-k dielectric layer. In some embodiments, the high-k dielectric layer is made of dielectric material with high dielectric constant (k value), for example, greater than 3.9. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), a combination thereof, or another suitable material. The high-k dielectric layer may be deposited using ALD, PVD, CVD, and/or another suitable technique.

The metal gate electrode layer 122 is formed to fill remainders of the gate trenches, in accordance with some embodiments. In some embodiments, the metal gate electrode layer 122 is made of more than one conductive material, such as a metal, metal alloy, conductive metal oxide and/or metal nitride, another suitable conductive material, and/or a combination thereof. For example, the metal gate electrode layer 122 may be made of Ti, Ag, Al, TiAlN, TaC, TaCN, TaSiN, Mn, Zr, TiN, TaN, Ru, Mo, WN, Cu, W, Re, Ir, Co, Ni, another suitable conductive material, or multilayers thereof.

The metal gate electrode layer 122 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 122 may be formed using ALD, PVD, CVD, e-beam evaporation, or another suitable technique. The metal gate electrode layer 122 may be formed separately for n-channel FinFETs and p-channel FinFETs, which may use different work function materials.

A planarization process such as CMP may be performed on the semiconductor structure 100 to remove the materials of the gate dielectric layer 120 and the metal gate electrode layer 122 formed above the upper surface of the lower interlayer dielectric layer 114, in accordance with some embodiments.

A portion of the final gate stack 116A overlapping the fin structure 104A combine with the neighboring source/drain features 134 to form a transistor T1; a portion of the final gate stack 116B overlapping the fin structure 104A combine with the neighboring source/drain features 134 to form a transistor T2; a portion of the final gate stack 116C overlapping the fin structure 104A combine with the neighboring source/drain features 134 to a form transistor T3; and a portion of the final gate stack 116D overlapping the fin structure 104A combine with the neighboring source/drain features 134 to form a transistor T4, in accordance with some embodiments.

A portion of the final gate stacks 116A overlapping the fin structure 104B combine with the neighboring source/drain features 134 to form a transistor T5; a portion of the final gate stacks 116B overlapping the fin structure 104B combine with the neighboring source/drain features 134 to form a transistor T6; a portion of the final gate stacks 116C overlapping the fin structure 104B combine with the neighboring source/drain features 134 to a form transistor T7; and a portion of the final gate stacks 116D overlapping the fin structure 104B combine with the neighboring source/drain features 134 to form a transistor T8, in accordance with some embodiments. In some embodiments, the transistor T1-T8 constitute a unit cell of the semiconductor structure.

The gate spacer layers 108 and the final gate stacks 116 are recessed by one or more etching processes, in accordance with some embodiments. The metal cap layers 124 are formed over the gate dielectric layer 120 and the gate electrode layer 122 in the recesses, as shown in FIGS. 2A-1 and 2A-2, in accordance with some embodiments.

In some embodiments, the metal cap layers 124 are made of metals such as W, Re, Ir, Co, Ni, Ru, Mo, Al, Ti, Ag, another suitable metal, or a combination thereof. The metal cap layer 124 may be formed by a deposition process (such as ALD, PVD, CVD, e-beam evaporation, or another suitable technique) followed by an etching process. In some embodiments, the metal cap layers 124 are made of fluorine-free tungsten, which may lower the total resistance of the gate stack.

Dielectric cap layers 126 are formed over the metal cap layers 124, as shown in FIGS. 2A-1 and 2A-2, in accordance with some embodiments. In some embodiments, the dielectric cap layers 126 are made of a dielectric material, such as silicon nitride (SiN), silicon carbide (SiC), silicon oxynitride (SiON), silicon oxide ($SiO_2$), silicon carbon nitride (SiCN), silicon oxide carbonitride (SiOCN), and/or a combination thereof. The dielectric cap layers 126 may be configured to protect the gate spacer layers 108 and the final gate stacks 116 during the subsequent formation of contact plugs. In some embodiments, the dielectric cap layers 126 are made of a different material than the lower interlayer dielectric layer 114 and have a different etching selectivity than the lower interlayer dielectric layer 114.

Figures 2, 2A, 3:
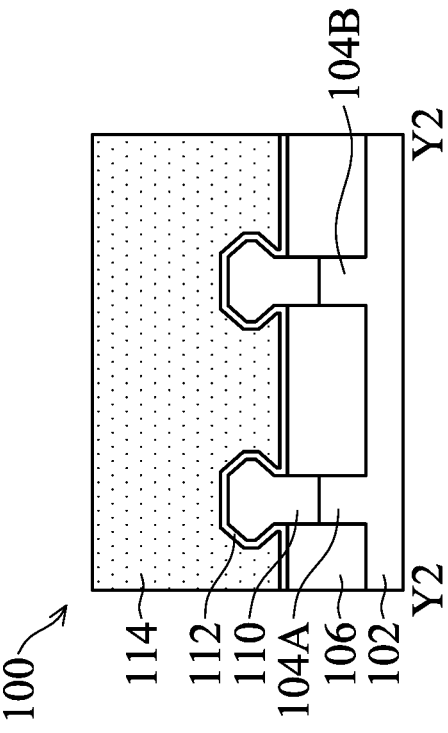
Figure 2B:
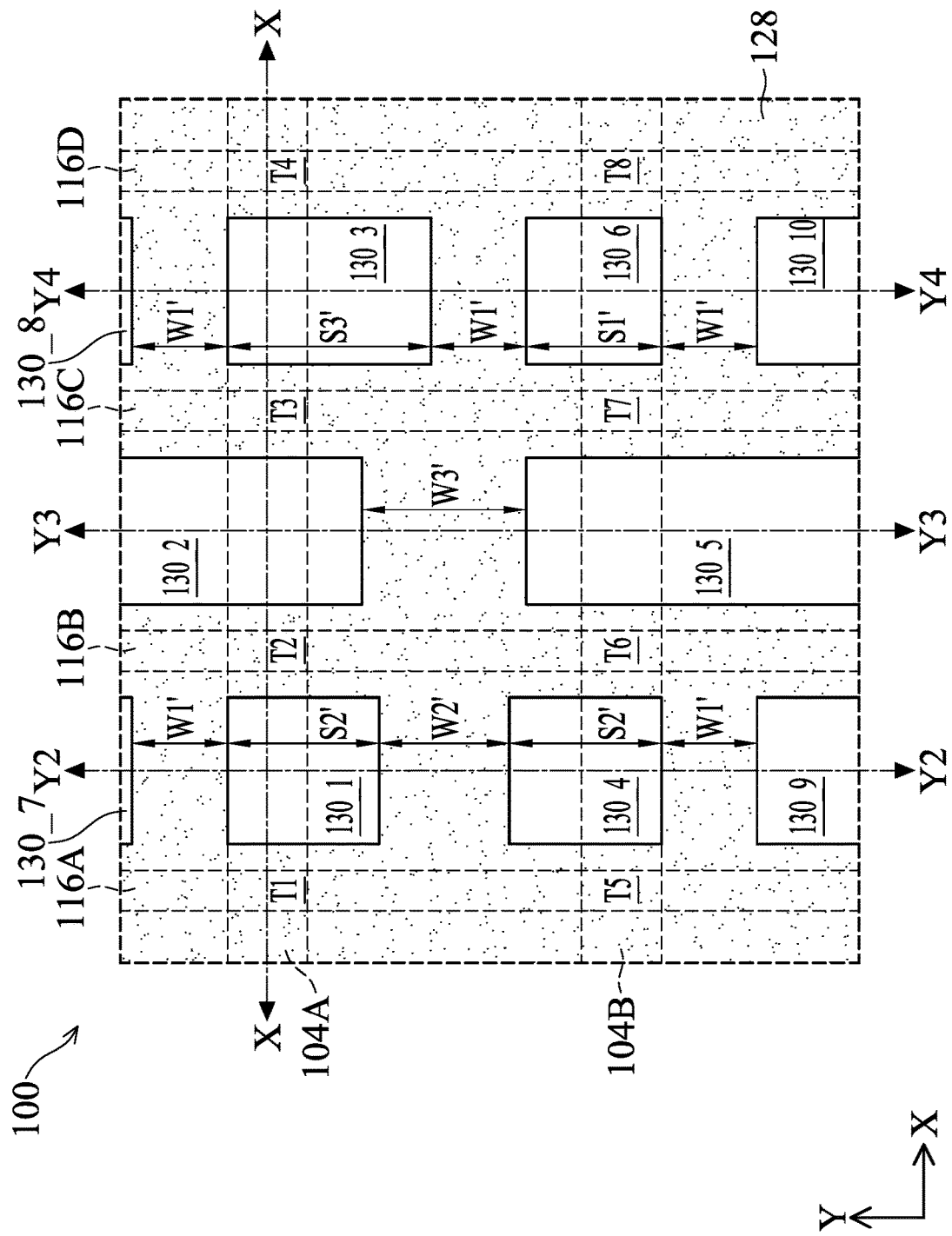
Figures 1, 2B:
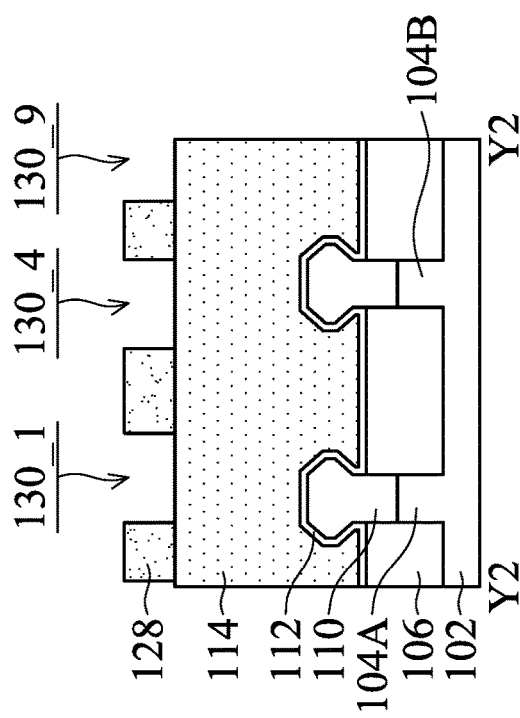
Figures 2, 2B:
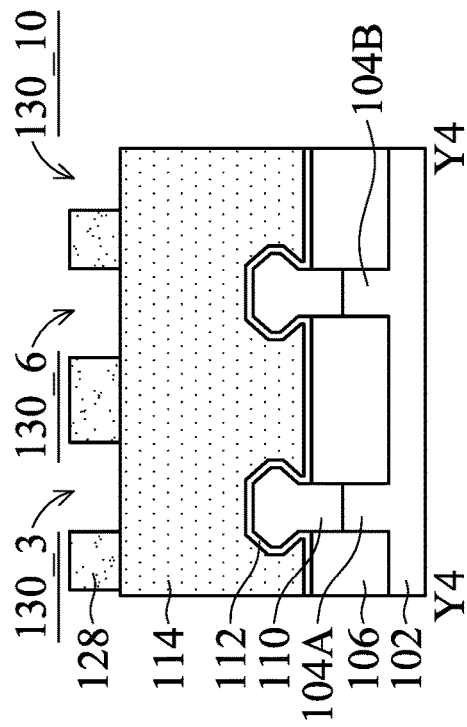
Figures 2, 2B, 3:
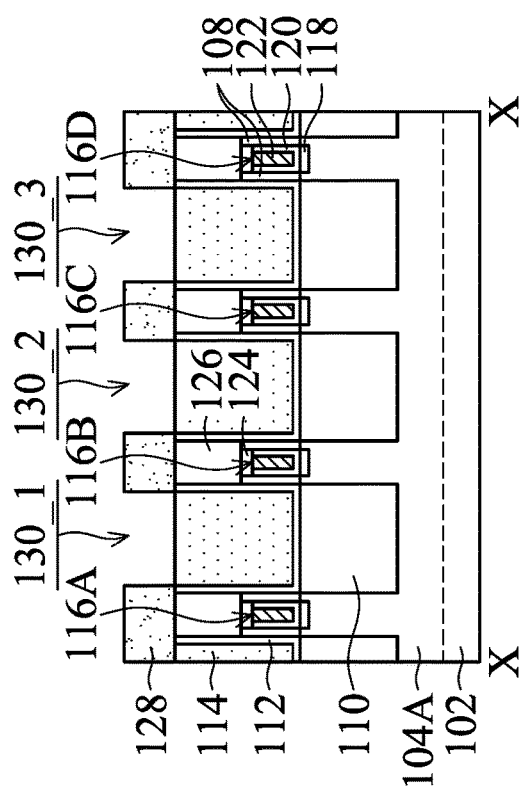
Figures 2, 2B, 3, 4:
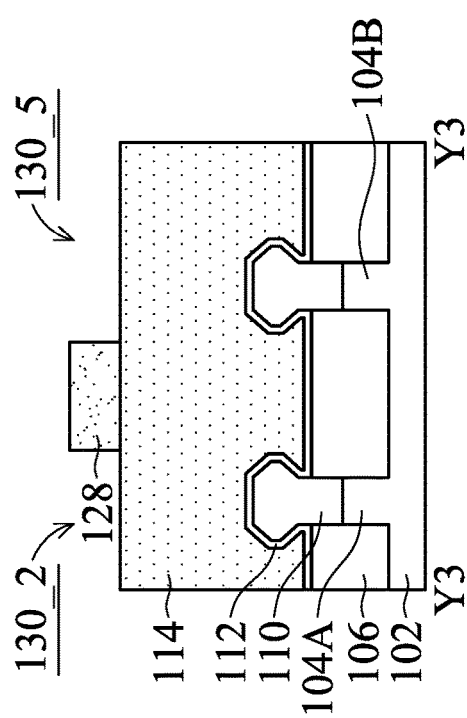

FIG. 2B is a plan view of a semiconductor structure 100 after the formation of a patterned mask layer 128, in accordance with some embodiments. FIGS. 2B, 2B-1, 2B-2, 2B-3 and 2B-4 are cross-sectional views taken along line X-X, line Y2-Y2, line Y3-Y3 and line Y4-Y4 shown in FIG. 2B, respectively.

A patterned mask layer 128 is formed over the contact etching stop layer 112, the lower interlayer dielectric layer 114 and the dielectric cap layers 126, as shown in FIGS. 2B, 2B-1, 2B-2, 2B-3 and 2B-4, in accordance with some embodiments. The patterned mask layer 128 is a patterned photoresist layer, a patterned hard mask layer, and/or a combination thereof, in accordance with some embodiments.

In some embodiments, a photoresist is formed on the contact etching stop layer 112, the lower interlayer dielectric layer 114, and the dielectric cap layers 126, such as by using spin-on coating, and patterned with opening patterns 130 (including 130_1 through 130_10) corresponding to the underlying source/drain features 110 by exposing the photoresist to light using an appropriate photomask. Exposed or unexposed portions of the photoresist may be removed depending on whether a positive or negative resist is used.

In alternative embodiments, a hard mask layer may be formed on the contact etching stop layer 112, the lower interlayer dielectric layer 114, and the dielectric cap layers 126. The hard mask layer may include, or be formed of, a nitrogen-free anti-reflection layer (NFARL), carbon-doped silicon dioxide (e.g., SiO$_2$:C), titanium nitride (TiN), titanium oxide (TiO), boron nitride (BN), a multilayer thereof, another suitable material, and/or a combination thereof. The hard mask layer may be etched using a patterned photoresist patterned photoresist layer, which may be formed by the photolithography described above and etching processes, thereby having the opening patterns 130_1 through 130_10 in the hard mask layer and corresponding to the underlying source/drain features 110.

The opening patterns 130_1 through 130_ expose a portion of the upper surface of the lower interlayer dielectric layer 114, in accordance with some embodiments. The patterned mask layer 128 covers another portion of the upper surface of the lower interlayer dielectric layer 114, the upper surface of the contact etching stop layer 112, and the upper surfaces of the dielectric cap layers 126, in accordance with some embodiments.

In some embodiments, the opening patterns 130_1, 130_2 and 130_3 correspond to the source/drain regions SD1, SD2 and SD3 of the fin structure 104A. In some embodiments, the opening patterns 130_4, 130_5 and 130_6 correspond to the source/drain regions SD4, SD5 and SD6 of the fin structure 104B. The opening patterns 130_7 and 130_8 the source/drain regions of another fin structure that is not illustrated in the figures, and the opening patterns 130_9 and 130_10 may correspond to the source/drain regions of another fin structure that is not illustrated in the figures.

In some embodiments, the opening pattern 130_6 has a first dimension S1' in the Y direction. In some embodiments, the opening patterns 130_1 and 130_4 have a second dimension S2' in the Y direction. In some embodiments, the opening pattern 130_3 has a third dimension S3' in the Y direction. In some embodiments, the first dimension S1 is less than the second dimension S2, and the second dimension S2 is less than the third dimension S3. In some embodiments, the first dimension S1' is the minimum critical dimension (CD) of the opening pattern 130 which can be obtained by the photolithography process. Although not denoted in figures, the opening pattern 130_2 and/or opening pattern 130_5 has a fourth dimension in the Y direction that is greater than the third distance S3.

In some embodiments, the opening pattern 130_1 is spaced apart from the opening pattern 130_7 by a first distance W1'. In some embodiments, the opening pattern 130_3 is spaced apart from the opening pattern 130_8 also by the first distance W1'. In some embodiments, the opening pattern 130_3 is spaced apart from the opening pattern 130_6 also by the first distance W1'. In some embodiments, the opening pattern 130_4 is spaced apart from the opening pattern 130_9 also by the first distance W1'. In some embodiments, the opening pattern 130_6 is spaced apart from the opening pattern 130_10 also by the first distance W1'. In some embodiments, the opening pattern 130_1 is spaced apart from the opening pattern 130_4 by a second distance W2'. In some embodiments, the opening pattern 130_2 is spaced apart from the opening pattern 130_5 by a third distance W3'.

In some embodiments, the first distance W1' is less than the second distance W2', and the second distance W2' is less than the third distance W3'. In some embodiments, the first distance W1' is the minimum critical dimension of the patterned mask layer 128 which can be obtained by the photolithography process.

A sidewall (or an edge) of the opening pattern 130_1 facing the opening pattern 130_7 is aligned with a sidewall (or an edge) of the opening pattern 130_3 facing the opening pattern 130_8, as shown in FIG. 2B, in accordance with some embodiments. In addition, the sidewall of the opening pattern 130_1 facing the opening pattern 130_7 and the sidewall of the opening pattern 130_3 facing the opening pattern 130_8 are aligned over a sidewall (or an edge) of the fin structure 104A.

A sidewall (or an edge) of the opening pattern 130_4 facing the opening pattern 130_9 is aligned with a sidewall (or an edge) of the opening pattern 130_6 facing the opening pattern 130_10, as shown in FIG. 2B, in accordance with some embodiments. In addition, the sidewall of the opening pattern 130_4 facing the opening pattern 130_9 and the sidewall of the opening pattern 130_6 facing the opening pattern 130_10 are aligned over a sidewall (or an edge) of the fin structure 104B.

A sidewall (or an edge) of the opening pattern 130_7 facing the opening pattern 130_1 is aligned with a sidewall (or an edge) of the opening pattern 130_8 facing the opening pattern 130_3, as shown in FIG. 2B, in accordance with some embodiments.

A sidewall (or an edge) of the opening pattern 130_9 facing the opening pattern 130_4 is aligned with a sidewall (or an edge) of the opening pattern 130_10 facing the opening pattern 130_6, as shown in FIG. 2B, in accordance with some embodiments.

A sidewall (or an edge) of the opening pattern 130_5 facing the opening pattern 130_2 is aligned with a sidewall (or an edge) of the opening pattern 130_6 facing the opening pattern 130_3, as shown in FIG. 2B, in accordance with some embodiments.

A horizontal extending line of a sidewall (or an edge) of the opening pattern 130_1 facing the opening pattern 130_4 is located between a horizontal extending line of a sidewall (or an edge) of the opening pattern 130_2 facing the opening pattern 130_5 and a horizontal extending line of a sidewall (or an edge) of the opening pattern 130_3 facing the opening pattern 130_6, in accordance with some embodiments.

A horizontal extending line of a sidewall (or an edge) of the opening pattern 130_4 facing the opening pattern 130_1 passes through between the opening patterns 130_3 and 130_6, in accordance with some embodiments.

Figure 2C:
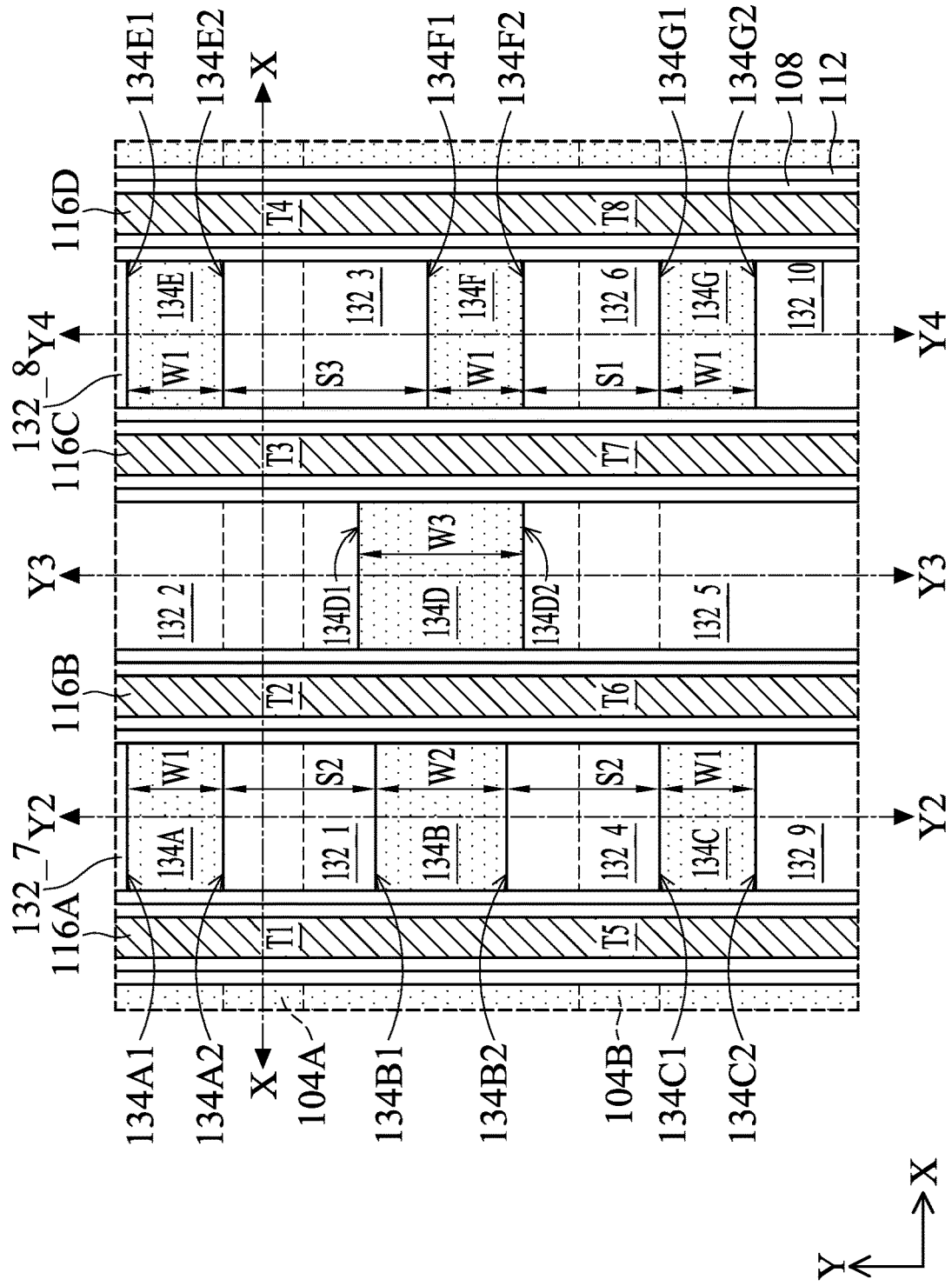

FIG. 2C is a plan view of a semiconductor structure 100 after an etching process, in accordance with some embodiments. FIGS. 2C-1, 2C-2, 2C-3 and 2C-4 are cross-sectional views taken along line X-X, line Y2-Y2, line Y3-Y3 and line Y4-Y4 shown in FIG. 2C, respectively.

An etching process is performed on the semiconductor structure 100 using the patterned mask layer 128 to remove the portion of the lower interlayer dielectric layer 114 exposed from the opening patterns 130_1 through 130_8, thereby forming contact openings 132 (including 132_1 through 132_10), as shown in FIGS. 2C, 2C-1, 2C-2, 2C-3 and 2C-4, in accordance with some embodiments. The etch processes may include dry etching such as reactive ion etch (RIE), neutral beam etch (NBE), inductive coupled plasma (ICP) etch, capacitively coupled plasma (CCP) etch, another suitable method, or a combination thereof. In some embodiments, the patterned mask layer 128 is removed during the etching process or by an additional etching or ashing process.

The contact openings 132_1 through 132_10 extend through the lower interlayer dielectric layer 114 and the underlying contact etching stop layer 112 to expose the source/drain features 110, in accordance with some embodiments. In some embodiments, portions of the source/drain features 110 exposed by the contact openings are partially recessed in the etching process.

In some embodiments, the contact openings 132_1, 132_2 and 132_3 correspond to the source/drain regions SD1, SD2 and SD3 of the fin structure 104A. In some embodiments, the contact openings 132_4, 132_5 and 132_6 correspond to the source/drain regions SD4, SD5 and SD6 of the fin structure 104B. The contact openings 132_7 and 132_8 may correspond to the source/drain regions of another fin structure that is not illustrated in the figures, and the contact openings 132_9 and 132_10 may correspond to the source/drain regions of another fin structure that is not illustrated in the figures.

After the etching process, an upper portion of the lower interlayer dielectric layer 114 is patterned into multiple insulating features 134 (including 134A-134G) which are separated from one another, as shown in FIGS. 2C, 2C-2, 2C-3 and 2C-4, in accordance with some embodiments. In some embodiments, the insulating features 134A-134G may also be referred to as cut metal diffusion (CMD) features.

The insulating feature 134A is located between the final gate stacks 116A and 116B and between the contact openings 132_7 and 132_1, in accordance with some embodiments. In some embodiments, the insulating feature 134A has a first dimension W1 in the Y direction in a range from about 9 nm to about 54 nm, such as from about 14.4 nm to about 21.6 nm.

The insulating feature 134B is located between the final gate stacks 116A and 116B and between the contact openings 132_1 and 132_4, in accordance with some embodiments. In some embodiments, the insulating feature 134B has a second dimension W2 in the Y direction in a range from about 12 nm to about 72 nm, such as from about 19.2 nm to about 28.8 nm.

The insulating feature 134C is located between the final gate stacks 116A and 116B and between the contact openings 132_4 and 132_9, in accordance with some embodiments. In some embodiments, the insulating feature 134C also has the first dimension W1 in the Y direction in a range from about 9 nm to about 54 nm, such as from about 14.4 nm to about 21.6 nm.

The insulating feature 134D is located between the final gate stacks 116B and 116C and between the contact openings 132_2 and 132_5, in accordance with some embodiments. In some embodiments, the insulating feature 134D has a third dimension W3 in the Y direction in a range from about 15 nm to about 90 nm, such as from about 24 nm to about 36 nm.

The insulating feature 134E is located between the final gate stacks 116C and 116D and between the contact openings 132_8 and 132_3, in accordance with some embodiments. In some embodiments, the insulating feature 134E also has the first dimension W1 in the Y direction in a range from about 9 nm to about 54 nm, such as from about 14.4 nm to about 21.6 nm.

The insulating feature 134F is located between the final gate stacks 116C and 116D and between the contact openings 132_3 and 132_6, in accordance with some embodiments. In some embodiments, the insulating feature 134F also has the first dimension W1 in the Y direction in a range from about 9 nm to about 54 nm, such as from about 14.4 nm to about 21.6 nm.

The insulating feature 134G is located between the final gate stacks 116C and 116D and between the contact openings 132_6 and 132_10, in accordance with some embodiments. In some embodiments, the insulating feature 134G also has the first dimension W1 in the Y direction in a range from about 9 nm to about 54 nm, such as from about 14.4 nm to about 21.6 nm.

In some embodiments, the first dimension W1 is less than the second dimension W2, and the second dimension W2 is less than the third dimension W3. In some embodiments, the first dimension W1 is the minimum critical dimension (CD) of the insulating features 134 which can be obtained by the photolithography and etching processes.

In some embodiments, the insulating feature 134A is spaced apart from the insulating feature 134B by a second distance S2 (i.e., the dimension of the contact opening 132_1 in the Y direction) in a range from about 13.5 nm to about 81 nm, such as from about 21.6 nm to about 32.4 nm. In some embodiments, the second distance S2 is greater than the second dimension W2.

In some embodiments, the insulating feature 134B is spaced apart from the insulating feature 134C also by the second distance S2 (i.e., the dimension of the contact opening 132_4 in the Y direction) in a range from about 13.5 nm to about 81 nm, such as from about 21.6 nm to about 32.4 nm.

In some embodiments, the insulating feature 134E is spaced apart from the insulating feature 134F by a third distance S3 (i.e., the dimension of the contact opening 132_3 in the Y direction) in a range from about 18 nm to about 108 nm, such as from about 28.8 nm to about 43.2 nm. In some embodiments, the third distance S3 is greater than the third dimension W3.

In some embodiments, the insulating feature 134F is spaced apart from the insulating feature 134G also by the first distance S1 (i.e., the dimension of the contact opening 132_6 in the Y direction) in a range from about 12 nm to about 72 nm, such as from about 19.2 nm to about 28.8 nm. In some embodiments, the first distance S1 is greater than the first dimension W1. In some embodiments, the first distance S1 is substantially equal to the second dimension W2.

In some embodiments, the first distance S1 is less than the second distance S2, and the second distance S2 is less than the third distance S3. In some embodiments, the first distance S1 is the minimum critical dimension of the contact openings 132 which can be obtained by the photolithography and etching processes.

Although not denoted in figures, a fourth distance in the Y direction (i.e., the dimensions of the contact opening 132_2 and/or contact opening 132_5 in the Y direction) between the insulating feature 134D and a neighboring insulating feature is greater than the third distance S3.

In some embodiments, the insulating feature 134G and the contact opening 132_6 have a first pitch (i.e., the sum of the first dimension W1 and the first distance S1). In some embodiments, the insulating feature 134C and the contact opening 132_4 have a second pitch (i.e., the sum of the first dimension W1 and the second distance S2). In some embodiments, the second pitch is greater than the first pitch.

In some embodiments, the insulating feature 134B and the contact opening 132_1 have a third pitch (i.e., the sum of the second dimension W2 and the second distance S2) that is greater than the second pitch. In some embodiments, the insulating feature 134F and the contact opening 132_3 have a fourth pitch (i.e., the sum of the first dimension W1 and the third distance S3). In some embodiments, the fourth pitch is greater than the third pitch.

In some embodiments, with a fixed cell height, the dimensions (e.g., W1, W2 and W3) of the insulating features 134 and/or the distances (e.g., S1, S2 and S3) between the insulating features 134 may be selected according to the demands on the design of the semiconductor device and/or performance considerations.

For example, the insulating features 134 having a smaller dimension (i.e., the contact openings 132 having a greater dimension) may relax critical dimension of metal lines (e.g., first metal layer (M0)) and/or provide greater flexibility for the routing in the metal lines, thereby reducing the manufacturing difficulty of the metal lines. For example, the insulating features 134 having a greater dimension (the contact openings 132 having a smaller dimension) may reduce the parasitic capacitance between the final gate stack and subsequently formed contact plug, thereby enhance the performance of the resulting semiconductor device (e.g., speed).

During the etching process for forming the insulating features 134, residues, polymers and/or etching byproducts (e.g., photoresist scum) may be generated and pile up on the sidewalls of the insulating features 134, which may limit the minimum distance between two adjacent isolation features 134. If two adjacent isolation features 134 are designed to be too close to each other, the adjacent isolation features 134 may merge and the contact opening 132 between them may be formed in such a way that it does not extend to the underlying source/drain feature 110, which may cause an open circuit, and thus the manufacturing yield of the resulting semiconductor device may decrease. In addition, the greater the dimension of the insulating feature 134, the more residues, polymers and/or etching byproducts (e.g., photoresist scum) may be generated, in accordance with some embodiments. Therefore, the minimum distance between adjacent isolation features 134 that can be achieved depends on the dimension of the adjacent insulating features 134.

For example, the minimum distance between the insulating feature 134F (with the first dimension W1) and the insulating feature 134G (with the first dimension W1) may be the first distance S1, in accordance with some embodiments. The minimum distance between the insulating feature 134B (with the second dimension W2) and the insulating feature 134C (with the first dimension W1) may be the second distance S2 that is greater than the first distance S1 because the insulating feature 134B is longer than the insulating feature 134F, in accordance with some embodiments.

If the distance between the insulating feature 134B and the insulating feature 134C is less than the second distance S2, the contact opening 132_4 between them may be formed in such a way that it does not extend to the underlying source/drain feature 110 because the etching amount here is limited by residues, polymers and/or etching byproducts (e.g., photoresist scum).

Similarly, the minimum distance between the insulating feature 134A (with the first dimension W1) and the insulating feature 134B (with the second dimension W2) may be the second distance S2 that is greater than the first distance S1, in accordance with some embodiments.

In some embodiments, the ratio (W2/W1) of the second dimension W2 to the first dimension W1 is in a range from about 1.1 to about 1.5. If the ratio (W2/W1) is too great (or the second dimension W2 is too great), the risk that adjacent isolation features 134 merge may increase. If the ratio (W2/W1) is too low (or the second dimension W2 is too low), the parasitic capacitance between the final gate stack and the subsequently formed contact plug may increase.

In some embodiments, the ratio (S2/S1) of the second distance S2 to the first distance S1 is greater than 1.0, e.g., in a range from about 1.0 to about 1.4. If the ratio (S2/S1) is too great (or the second dimension S2 is too great), the parasitic capacitance between the final gate stack and the subsequently formed contact plug may increase. If the ratio (S2/S1) is too low (or the second dimension W2 is too low), the risk that adjacent isolation features 134 merge may increase.

A sidewall 134A1 (or an edge) of the insulating feature 134A facing away from the fin structure 104A is aligned with a sidewall 134E1 (or an edge) of the insulating feature 134E facing away from the fin structure 104A, as shown in FIG. 2C, in accordance with some embodiments. That is, a horizontal extending line of the sidewall 134A1 of the insulating feature 134A and a horizontal extending line of the sidewall 134E1 of the insulating feature 134E are substantially colinear, in accordance with some embodiments.

A sidewall (or an edge) 134A2 of the insulating feature 134A facing the fin structure 104A is aligned with a sidewall (or an edge) 134E2 of the insulating feature 134E facing the fin structure 104A, as shown in FIG. 2C, in accordance with some embodiments. That is, a horizontal extending line of the sidewall 134A2 of the insulating feature 134A and a horizontal extending line of the sidewall 134E2 of the insulating feature 134E are substantially colinear, in accordance with some embodiments.

In addition, the sidewall 134A2 of the insulating feature 134A and the sidewall 134E2 of the insulating feature 134E are aligned over a sidewall (or an edge) of the fin structure 104A, as shown in FIGS. 2C, 2C-2 and 2C-4, in accordance with some embodiments. That is, a vertical extending line of the sidewall 134A2 of the insulating feature 134A and a vertical extending line of the sidewall of the fin structure 104A are substantially colinear; a vertical extending line of the sidewall 134E2 of the insulating feature 134E and a vertical extending line of the sidewall of the fin structure 104A are substantially colinear, in accordance with some embodiments.

A sidewall 134C1 (or an edge) of the insulating feature 134C facing the fin structure 104B is aligned with a sidewall 134G1 (or an edge) of the insulating feature 134G facing the fin structure 104B, as shown in FIG. 2C, in accordance with some embodiments. That is, a horizontal extending line of the sidewall 134C1 of the insulating feature 134C and a horizontal extending line of the sidewall 134G1 of the insulating feature 134G are substantially colinear, in accordance with some embodiments.

In addition, the sidewall 134C1 of the insulating feature 134C and the sidewall 134G1 of the insulating feature 134G are aligned over a sidewall (or an edge) of the fin structure 104B, as shown in FIGS. 2C, 2C-2 and 2C-4, in accordance with some embodiments. That is, a vertical extending line of the sidewall 134C1 of the insulating feature 134C and a vertical extending line of the sidewall of the fin structure 104B are substantially colinear; a vertical extending line of the sidewall 134G1 of the insulating feature 134G, and a vertical extending line of the sidewall of the fin structure 104B are substantially colinear, in accordance with some embodiments.

A sidewall 134C2 (or an edge) of the insulating feature 134C facing away from the fin structure 104B is aligned with a sidewall 134G2 (or an edge) of the insulating feature 134G facing away from the fin structure 104B, as shown in FIG. 2C, in accordance with some embodiments. That is, a horizontal extending line of the sidewall 134C2 of the insulating feature 134C and a horizontal extending line of the sidewall 134G2 of the insulating feature 134G are substantially colinear, in accordance with some embodiments.

A sidewall (or an edge) 134D2 of the insulating feature 134D facing the fin structure 104B is aligned with a sidewall (or an edge) 134F2 of the insulating feature 134F facing the fin structure 104B, as shown in FIG. 2C, in accordance with some embodiments. That is, a horizontal extending line of the sidewall 134D2 of the insulating feature 134D and a horizontal extending line of the sidewall 134F2 of the insulating feature 134F are substantially colinear, in accordance with some embodiments.

A horizontal extending line of a sidewall (or an edge) 134B1 of the insulating feature 134B facing the fin structure 104A is located between a sidewall (or an edge) 134D1 of the insulating feature 134D facing the fin structure 104A and a horizontal extending of a sidewall (or an edge) 134F1 of the insulating feature 134F facing the fin structure 104A, in accordance with some embodiments. In some embodiments, the extending line of the sidewall 134B1 is closer to the extending line of the sidewall 134D1 than to the extending line of the sidewall 134F1.

A horizontal extending line of a sidewall (or an edge) 134B2 of the insulating feature 134B facing the fin structure 104B is located between the horizontal extending of the sidewall 134F1 of the insulating feature 134F and the horizontal extending of the sidewall 134F2 of the insulating feature 134F, in accordance with some embodiments. In some embodiments, the extending line of the sidewall 134B2 is closer to the extending line of the sidewall 134F2 than to the extending line of the sidewall 134F1.

Figure 2D:
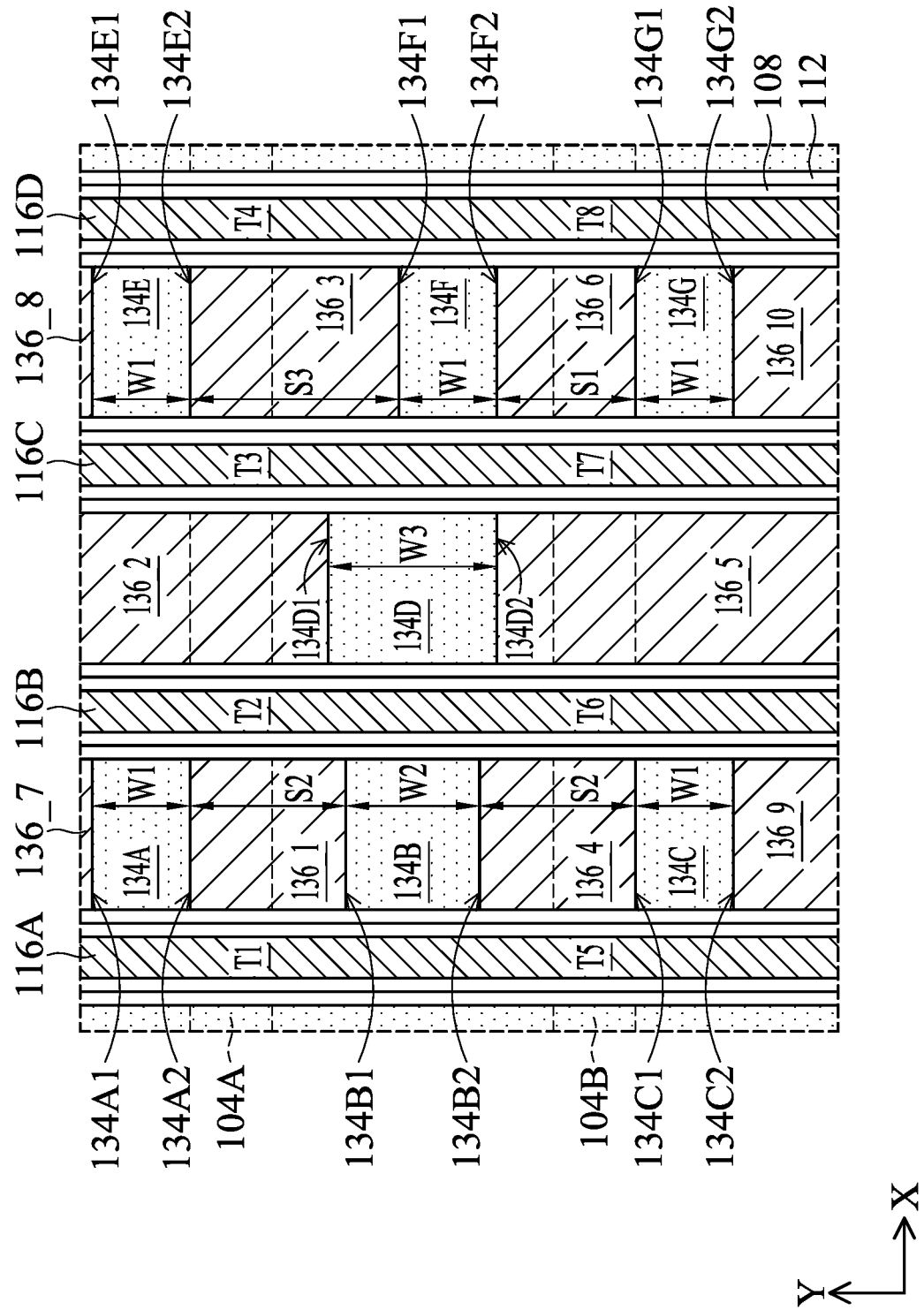
Figures 2, 2D:
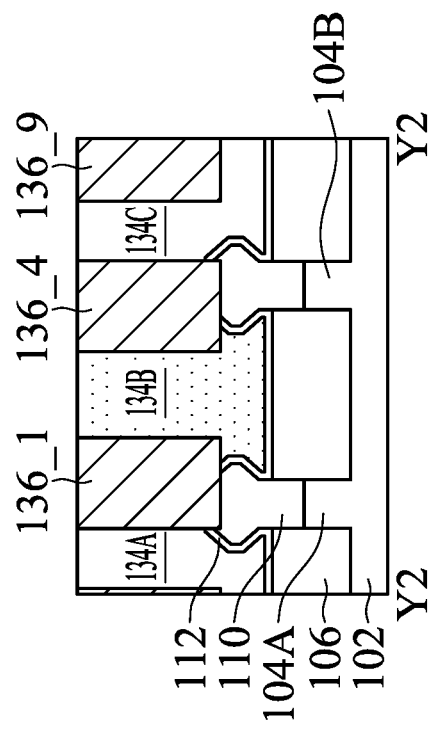
Figures 2, 2D, 3, 4:
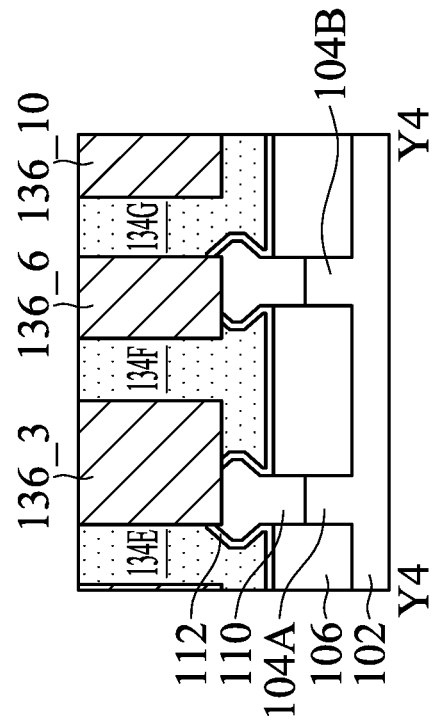
Figures 1, 2D:
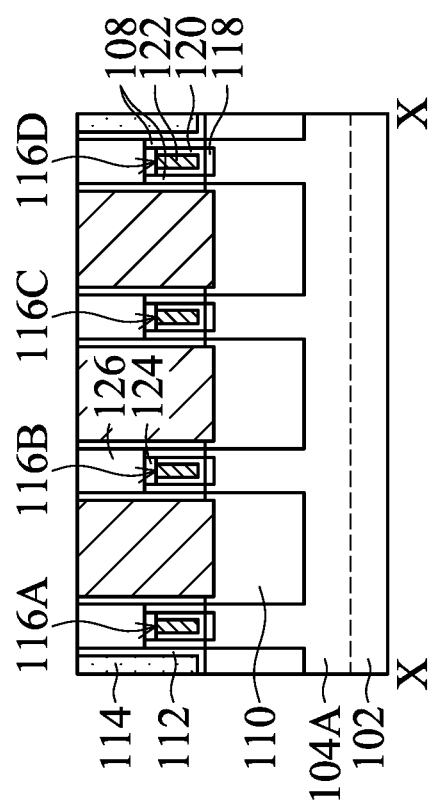
Figures 2, 2D, 3:
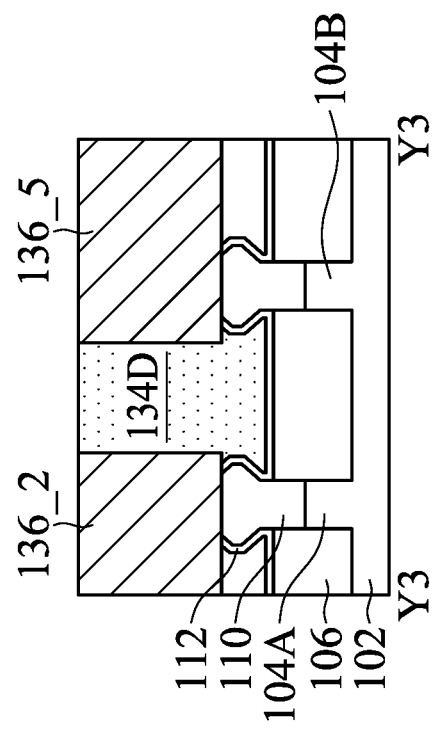

FIG. 2D is a plan view of a semiconductor structure 100 after the formation of contact plugs 136, in accordance with some embodiments. FIGS. 2D-1, 2D-2, 2D-3 and 2D-4 are cross-sectional views taken along line X-X, line Y2-Y2, line Y3-Y3 and line Y4-Y4 shown in FIG. 2D-, respectively.

Contact plugs 136 (including 136_1 though 135_10) are formed in the contact opening 132, as shown in FIGS. 2D, 2D-1, 2D-2 and 2D-3, in accordance with some embodiments. The contact plug 136 land on and are electrically connected to the source/drain features 110, in accordance with some embodiments.

In some embodiments, the formation of the contact plugs 136 includes forming a silicide layer (such as WSi, NiSi, TiSi and/or CoSi) on the exposed source/drain features 110, depositing one or more conductive materials over the silicide layer to fill the contact openings 132, and planarizing the one or more conductive materials until the upper surfaces of the lower interlayer dielectric layer 114 and the dielectric cap layers 126 are exposed using, for example, CMP. In some embodiments, the conductive material is deposited using CVD, PVD, e-beam evaporation, ALD, electroplating (ECP), electroless deposition (ELD), another suitable method, or a combination thereof. After the planarization process, the upper surfaces of the contact plugs 136, the upper surface of the lower interlayer dielectric layer 114 and the upper surfaces of the dielectric cap layers 126 are substantially coplanar, in accordance with some embodiments.

The conductive material may be a multilayer structure including, for example, liner layers, glue layers, barrier layers, seed layers, metal bulk layers, another suitable layer, and/or a combination thereof. For example, a barrier layer (not shown) may be formed along the sidewall and the bottom surface of the contact openings. The barrier layer is used to prevent the metal from the subsequently formed metal material from diffusing into the dielectric material (e.g., the lower interlayer dielectric layer 114). The barrier layer may be made of tantalum (Ta), tantalum nitride (TaN), titanium (Ti), titanium nitride (TiN), cobalt tungsten (CoW), another suitable material, and/or a combination thereof. In some embodiments, after the deposition of the barrier layer, an anneal process may be performed such that the metal from the barrier layer may react with the semiconductor material from the source/drain features 110, thereby forming the salicide layer. In alternative embodiments where the subsequently formed metal bulk material does not easily diffuse into the dielectric material (e.g., the lower interlayer dielectric layer 114), the barrier layer may be omitted.

Furthermore, a glue layer (not shown) may be formed along the sidewall and the bottom surface of the contact openings, and on the barrier layer (if formed). The glue layer is used to improve adhesion between the subsequently formed metal material and the dielectric material (e.g., the lower interlayer dielectric layer 114). The glue layer may be made of tantalum nitride (TaN), titanium (Ti), titanium nitride (TiN), another suitable material, and/or a combination thereof.

A metal bulk layer is then formed on the glue layer (if formed) to fill the remainder of the contact openings. In some embodiments, the metal bulk layer is formed using a selective deposition technique such as cyclic CVD process or ELD process, and it is not necessary to form a glue layer in the contact openings before depositing the metal bulk material. In some embodiments, the metal bulk layers are made of one or more conductive materials with low resistance and good gap-fill ability, for example, cobalt (Co), nickel (Ni), tungsten (W), titanium (Ti), tantalum (Ta), copper (Cu), aluminum (Al), ruthenium (Ru), molybdenum (Mo), another suitable metal material, and/or a combination thereof.

In some embodiments, the contact plugs 136_1, 136_2 and 136_3 correspond to the source/drain regions SD1, SD2 and SD3 of the fin structure 104A. In some embodiments, the contact plugs 136_4, 136_5 and 136_6 correspond to the source/drain regions SD4, SD5 and SD6 of the fin structure 104B. The contact plugs 136_7 and 136_8 may correspond to the source/drain regions of another fin structure that are not illustrated in the figures, the contact plugs 136_9 and 136_10 may correspond to the source/drain regions of another fin structure that are not illustrated in the figures.

In some embodiments, the contact plug 136_1 has a dimension in the Y direction that is substantially equal to the second distance S2. In some embodiments, the contact plug 136_3 has a dimension in the Y direction that is substantially equal to the third distance S3. In some embodiments, the contact plug 136_4 has a dimension in the Y direction that is substantially equal to the second distance S2. In some embodiments, the contact plug 136_6 has a dimension in the Y direction that is substantially equal to the first distance S1. Although not denoted in figures, the contact plug 136_2 and the contact plug 136_5 have dimensions in the Y direction that is greater than the third distance S3.

The insulating feature 134B (with the second dimension W2) is spaced apart from the insulating feature 134C (with the first dimension W1) by the second distance S2 that is greater than the first distance S1 and less than the third distance S3, in accordance with some embodiments. As a result, the risk of an open circuit being caused by the contact plug 136_4 not extending to the source/drain feature 110 may be significantly reduced, while the parasitic capacitance between the final gate stack 116A (or 116B) and the contact plug 136_4 may not significantly increase. Therefore, a good balance between performance and the manufacturing yield of the resulting semiconductor device may be achieved.

Similarly, the insulating feature 134A (with the first dimension W1) is spaced apart from the insulating feature 134B (with the second dimension W2) by the second distance S2 that is greater than the first distance Si and less than the third distance S3, in accordance with some embodiments. As a result, the risk of an open circuit being caused by the contact plug 136_1 not extending to the source/drain feature 110 may be significantly reduced while the parasitic capacitance between the final gate stack 116A (or 116B) and the contact plug 136_1 may not significantly increase. Therefore, a good balance between performance and the manufacturing yield of the resulting semiconductor device may be achieved.

A sidewall (or an edge) of the contact plug 136_1 interfaced with the insulating feature 134A is aligned with a sidewall (or an edge) of the contact plug 136_3 interfaced with the insulating feature 134E, as shown in FIG. 2D, in accordance with some embodiments. In addition, the sidewall of the contact plug 136_1 interfaced with the insulating feature 134A and the sidewall of the contact plug 136_3 interfaced with the insulating feature 134C are aligned over a sidewall (or an edge) of the fin structure 104A.

A sidewall (or an edge) of the contact plug 136_4 interfaced with the insulating feature 134C is aligned with a sidewall (or an edge) of the contact plug 136_6 interfaced with the insulating feature 134G, as shown in FIG. 2D, in accordance with some embodiments. In addition, the sidewall of the contact plug 136_4 interfaced with the insulating feature 134C and the sidewall of the contact plug 136_6 interfaced with the insulating feature 134G are aligned over a sidewall (or an edge) of the fin structure 104B.

A sidewall (or an edge) of the contact plug 136_7 interfaced with the insulating feature 134A is aligned with a sidewall (or an edge) of the contact plug 136_8 interfaced with the insulating feature 134E, as shown in FIG. 2D, in accordance with some embodiments.

A sidewall (or an edge) of the contact plug 136_9 interfaced with the insulating feature 134C is aligned with a sidewall (or an edge) of the contact plug 136_10 interfaced with the insulating feature 134G, as shown in FIG. 2D, in accordance with some embodiments.

A sidewall (or an edge) of the contact plug 136_5 interfaced with the insulating feature 134D is aligned with a sidewall (or an edge) of the contact plug 136_6 interfaced with the insulating feature 134F, as shown in FIG. 2D, in accordance with some embodiments.

A horizontal extending line of a sidewall (or an edge) of the contact plug 136_1 interfaced with the insulating feature 134B is located between a horizontal extending line of a sidewall (or an edge) of the contact plug 136_2 interfaced with the insulating feature 134D and a horizontal extending line of a sidewall (or an edge) of the contact plug 136_3 interfaced with the insulating feature 134F, in accordance with some embodiments.

A horizontal extending line of a sidewall (or an edge) of the contact plug 136_4 interfaced with the insulating feature 134B passes through between the opening patterns 130 3 and 130 6, in accordance with some embodiments.

Figure 2E:
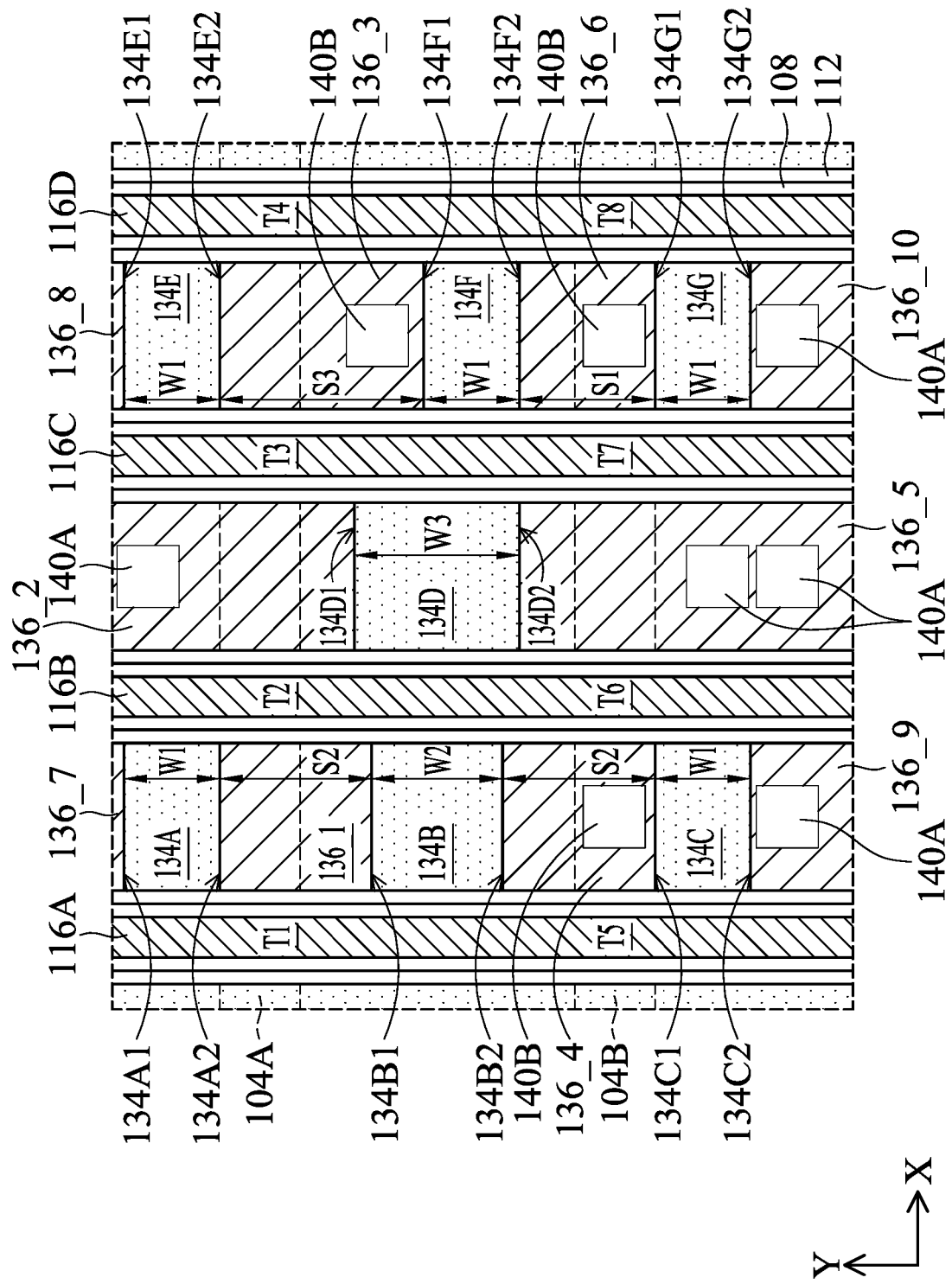
Figures 2, 2E:
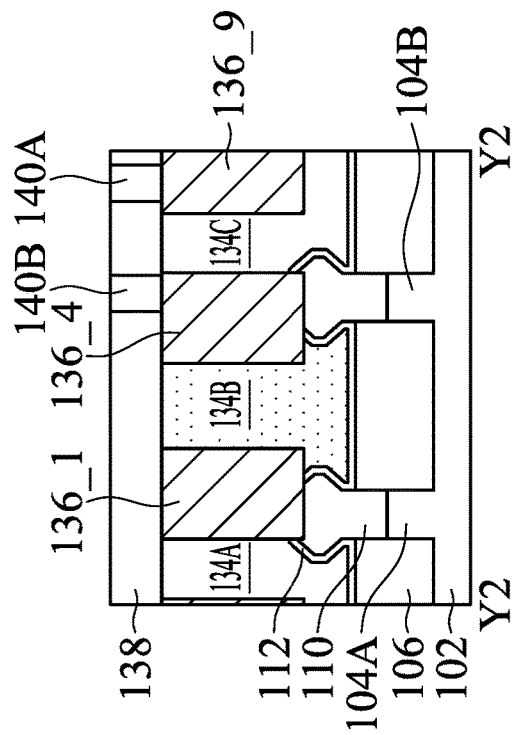
Figures 2, 2E, 3, 4:
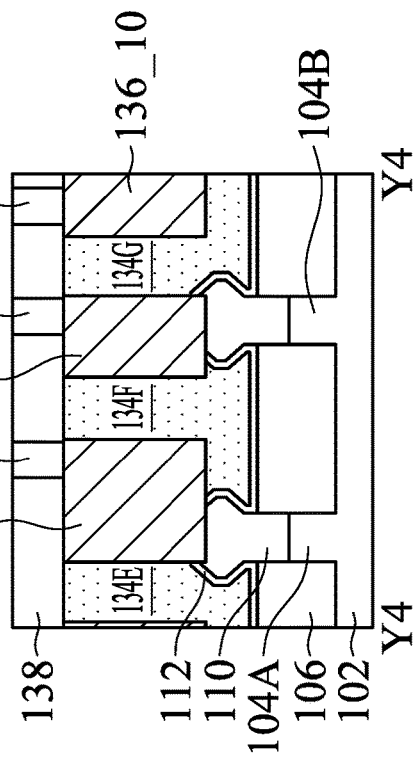
Figures 1, 2E:
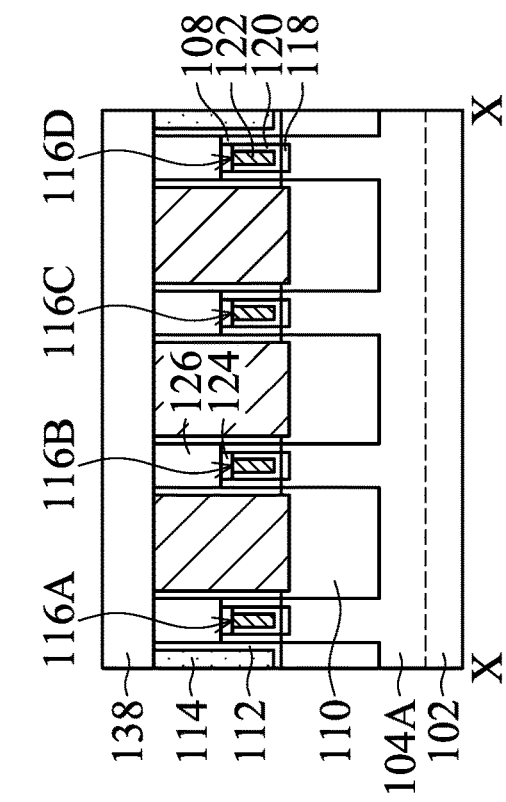
Figures 2, 2E, 3:
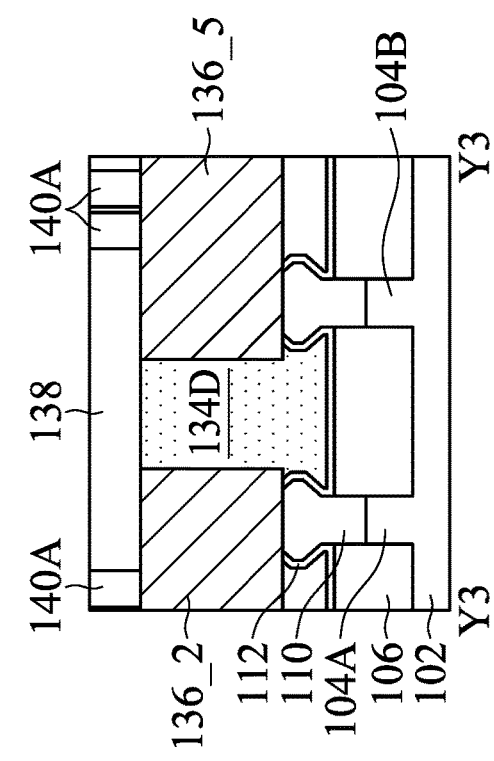
Figures 1, 3:
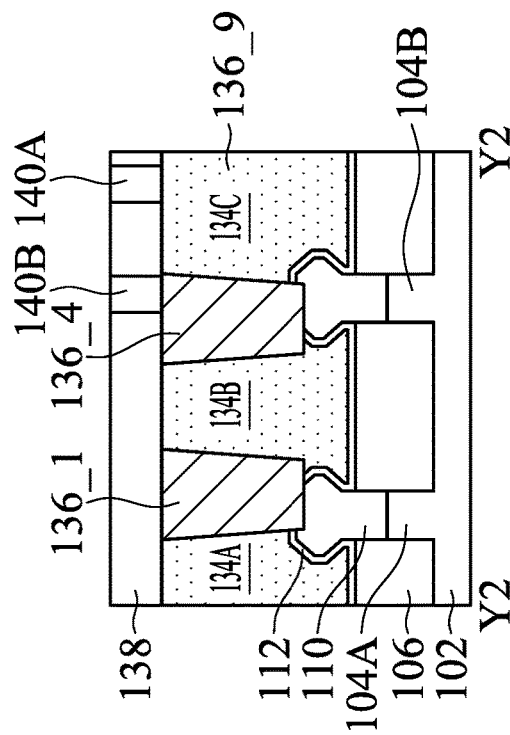
Figure 3:
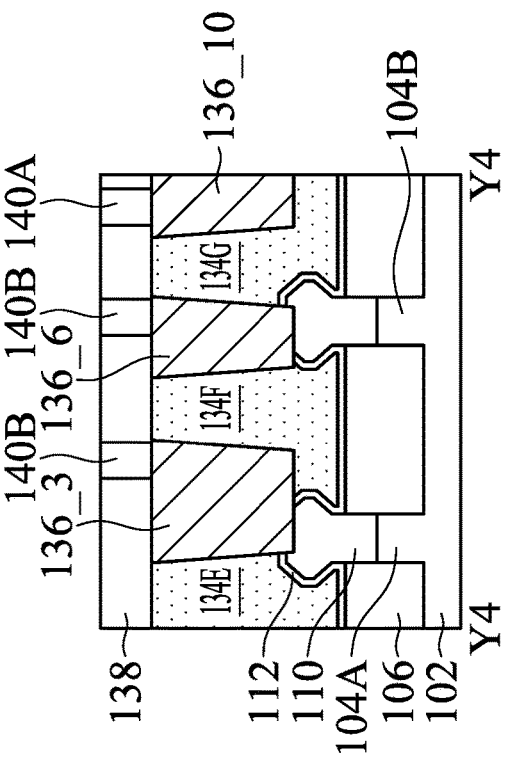
Figures 2, 3:
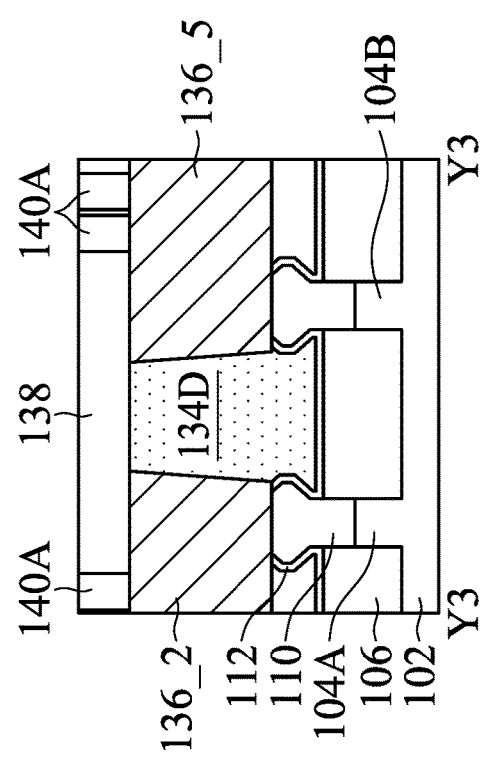

FIG. 2E is a plan view of a semiconductor structure 100 after the formation of an upper interlayer dielectric layer 138 and vias 136, in accordance with some embodiments. FIGS. 2E-1, 2E-2, 2E-3 and 2E-4 are cross-sectional views taken along line X-X, line Y2-Y2, line Y3-Y3 and line Y4-Y4 shown in FIG. 2E, respectively.

An upper (second) interlayer dielectric layer 138 is formed over the lower interlayer dielectric layer 114 and the dielectric cap 126, as shown in FIGS. 2E-1, 2E-2, 2E-3 and 2E-4, in accordance with some embodiments. In some embodiments, the upper interlayer dielectric layer 138 is made of a dielectric material, such as USG, or doped silicon oxide such as BPSG, FSG, PSG, BSG, another suitable dielectric material, and/or a combination thereof. In some embodiments, the upper interlayer dielectric layer 138 is formed using CVD (such as HDP-CVD, PECVD, HARP, or FCVD), ALD, another suitable method, and/or a combination thereof.

Vias 140 (including 140A and 140B) are formed in and/or through the upper interlayer dielectric layer 138 as shown in FIGS. 2E, 2E-1, 2E-2, 2E-3 and 2E-4, in accordance with some embodiments. The vias 140 land on and are electrically connected to the contact plugs 136, in accordance with some embodiments. In some embodiments, the vias 140A are the vias which electrically connected to the source terminals of the transistor, and the vias 140B are the vias which electrically connected to the drain terminals of the transistor. In some embodiments where the transistor T1 is a dummy transistor, no via 140 is formed on the contact plug 136_1.

In some embodiments where the source/drain region SD2 and SD5 are source regions, the vias 140A are formed on the contact plugs 136_2 and 136_5 and electrically connected to the source/drain features 110 over the source/drain region SD2 and SD5. In some embodiments, the vias 140A may be formed on the contact plugs 136_9 and 136_10. In some embodiments, the vias 140A are located outside the area of the fin structures 104A and 104B, as shown in FIG. 2E.

In some embodiments where the source/drain region SD3, SD4 and SD6 are drain regions, the vias 140B are formed on the contact plugs 136_3, 136_4 and 136_6 and electrically connected to the source/drain features 110 over the source/drain region SD3, SD4 and SD6. In some embodiments, the vias 140B formed on the contact plugs 136_4 and 136_6 are located within the area of the fin structure 104B, while the via 140B formed on the contact plug 136_3 is located outside the area of the fin structures 104A and 104B, as shown in FIG. 2E.

In some embodiments, the formation of the vias 140 includes patterning the upper interlayer dielectric layer 138 to form via openings (where the vias 140 are to be formed) through the upper interlayer dielectric layer 138 and exposing the contact plugs 136 using photolithography and etching processes, depositing one or more conductive materials for the vias 140 to fill the vias openings, and planarizing the one or more conductive materials over the upper surface of the upper interlayer dielectric layer 138 using, for example, CMP.

After the vias 140 are formed, additional components (such as contact to gate stacks, metal lines, etc.) may be formed over the semiconductor structure 100 to produce a semiconductor device. For example, a first metal layer (M0) may be formed on the upper interlayer dielectric layer 138 and the vias 140. The first metal layer may include multiple conductive lines which extend in the X direction and are electrically connected to the vias 140. In some embodiments, the metal lines provide different voltages to the source vias 140A and the drain contacts 140B.

FIGS. 3-1, 3-2 and 3-3 are a modification of FIGS. 2E-2, 2E-3 and 2E-4, in accordance with some embodiments. The embodiments shown in FIGS. 3-1, 3-2 and 3-3 is similar to the embodiments shown in FIGS. 2E-2, 2E-3 and 2E-4 except that the contact plugs 136 (including 136_1 through 135_10) have downward tapered sidewalls.

As described above, the aspect of the present disclosure is directed a configuration of CMD features (insulating features 134) which is used to isolate contact plugs from one another. The embodiments provide three dimensions W1, W2 and W3 (W1<W2<W3) for the insulating features 134 and three distances S1, S2 and S2 (S1<S2<S3) between them. The minimum distance between the insulating feature 134B having the second dimension W2 and the insulating feature 134C having the first dimension W1 may be the second distance S2. The second distance S2 is greater than the first distance S1, and thus the risk of an open circuit being caused by the contact plug 136_4 (between the insulating feature 134B and 134C) not extending to the source/drain feature 110 may be significantly reduced. The second distance S2 is less than the third distance S3, the parasitic capacitance between the final gate stack 116A (or 116B) and the contact plug 136_4 may not significantly increase. Therefore, a good balance between performance and the manufacturing yield of the resulting semiconductor device may be achieved.

Embodiments of a method for forming a semiconductor structure are provided. The method for forming the semiconductor structure may include forming a dielectric material over the first source/drain feature and the second source/drain feature over a fin structure, and patterning the dielectric layer into multiple insulating features spaced apart from one another, and forming a first contact plug to the first source/drain feature and a second contact plug to the second source/drain feature. A first insulating feature and a second insulating feature may be on opposite sides of the first source/drain feature, and a third insulating feature and a fourth insulating feature may be on opposite sides of the second source/drain feature. The first insulating feature is longer than the third insulating feature. A first distance between the first insulating feature and the second insulating feature may be greater than a second distance between the third insulating feature and the fourth insulating feature. Therefore, the risk of an open circuit being caused by the first contact plug (between the first and second insulating features) not extending to the first source/drain feature may be significantly reduced, which may improve the manufacturing yield of the resulting semiconductor device.

In some embodiments, a method for forming a semiconductor structure is provided. The method includes forming a first fin structure over a substrate, forming a first source/drain feature and a second source/drain feature over the first fin structure, forming a dielectric material over the first source/drain feature and the second source/drain feature, and patterning the dielectric layer into multiple insulating features spaced apart from one another. The insulating features include a first insulating feature and a second insulating feature on opposite sides of the first source/drain feature, and a third insulating feature and a fourth insulating feature on opposite sides of the second source/drain feature. A first dimension of the first insulating feature in a first direction is greater than a second dimension of the second insulating feature in the first direction, a third dimension of the third insulating feature in the first direction is less than the first dimension of the first insulating feature. A first distance between the first insulating feature and the second insulating feature is greater than a second distance between the third insulating feature and the fourth insulating feature. The method also includes forming a conductive material in a first opening between the first insulating feature and the second insulating feature and in a second opening between the third insulating feature and the fourth insulating feature.

In some embodiments, a method for forming a semiconductor structure is provided. The method includes forming a first source/drain feature, a second source/drain feature and a third source/drain feature over a first fin structure, and forming a fourth source/drain feature, a fifth source/drain feature and a sixth source/drain feature over a second fin structure. The second source/drain feature is located between the first source/drain feature and the third source/drain feature. The fifth source/drain feature is located between the fourth source/drain feature and the sixth source/drain feature. The method also includes forming a dielectric material over the first to sixth source/drain features, forming a patterned mask layer over the dielectric material, and etching the dielectric material using the patterned mask layer. The patterned mask layer has a first opening pattern corresponding to the first source/drain feature, a second opening pattern corresponding to the second source/drain feature, a third opening pattern corresponding to the third source/drain feature, a fourth opening pattern corresponding to the fourth source/drain feature, a fifth opening pattern corresponding to the fifth source/drain feature, and a sixth opening pattern corresponding to the sixth source/drain feature. A first distance between the first opening pattern and the fourth opening pattern is less than a second distance between the second opening pattern and the fifth opening pattern, and a third distance between the third opening pattern and the sixth opening pattern is less than the first distance.

In some embodiments, a semiconductor structure is provided. The semiconductor structure includes a first source/drain feature and a second source/drain feature over a first fin structure, a third source/drain feature and a fourth source/drain feature over a second fin structure, and a first contact plug, a second contact plug, a third contact plug and a fourth contact plug on the first source/drain feature, the second source/drain feature, the third first source/drain feature and the fourth source/drain feature, respectively. In a plan view, the second contact plug is longer than the third contact plug, and the third contact plug is longer than the fourth contact plug. The semiconductor structure also includes a first insulating feature sandwiched between the first contact plug and the third contact plug, and a second insulating feature sandwiched between the second contact plug and the fourth contact plug. In a plan view, the first insulating feature is longer than the second insulating feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a first fin structure over a substrate;
   forming a second fin structure over the substrate;
   forming a first source/drain feature and a second source/drain feature over the first fin structure;
   forming a third source/drain feature and a fourth source/drain feature over the second fin structure,
   forming a dielectric material over the first source/drain feature and the second source/drain feature;
   patterning the dielectric layer into multiple insulating features spaced apart from one another,
   wherein the insulating features include a first insulating feature and a second insulating feature on opposite sides of the first source/drain feature, and a third insulating feature and a fourth insulating feature on opposite sides of the second source/drain feature, a first dimension of the first insulating feature in a first direction is greater than a second dimension of the second insulating feature in the first direction, a third dimension of the third insulating feature in the first direction is less than the first dimension of the first insulating feature, and a first distance between the first insulating feature and the second insulating feature is greater than a second distance between the third insulating feature and the fourth insulating feature,
   wherein the insulating features further include a fifth insulating feature and a sixth insulating feature, the fifth insulating feature and the first insulating feature are located on opposite sides of the third source/drain feature, the sixth insulating feature and the third insulating feature are located on opposite sides of the fourth source/drain feature, and a third distance between the fifth insulating feature and the first insulating feature is less than a fourth distance between the sixth insulating feature and the third insulating feature; and
   forming a conductive material in a first opening between the first insulating feature and the second insulating feature and in a second opening between the third insulating feature and the fourth insulating feature.

2. The method for forming the semiconductor structure as claimed in claim 1, wherein a fourth dimension of the fourth insulating feature in the first direction is less than the first dimension of the first insulating feature.

3. The method for forming the semiconductor structure as claimed in claim 2, wherein the second dimension of the second insulating feature is substantially equal to the fourth dimension of the fourth insulating feature.

4. The method for forming the semiconductor structure as claimed in claim 1, further comprising:
   forming a first gate stack, a second gate stack, a third gate stack and a fourth gate stack across the first fin structure, wherein the first gate stack, the second gate stack, the third gate stack and the fourth gate stack extend in the first direction, wherein the first insulating feature and the second insulating feature are located between the first gate stack and the second gate stack, and the third insulating feature and the fourth insulating feature are located between the third gate stack and the fourth gate stack.

5. The method for forming the semiconductor structure as claimed in claim 4, wherein the insulating features further include a fifth insulating feature between the second gate stack and the third gate stack, wherein a fourth dimension of the fifth insulating feature in the first direction is greater than the first dimension of the first insulating feature.

6. The method for forming the semiconductor structure as claimed in claim 1, wherein the first insulating feature has a first sidewall facing the first opening and a second sidewall facing away from the first opening, the third insulating feature has a first sidewall facing the second opening and a second sidewall facing away from the second opening, and in a plan view, an extending line of the first sidewall of the first insulating feature is located between an extending line of the first sidewall of the second insulating feature and an extending line of the second sidewall of the second insulating feature.

7. The method for forming the semiconductor structure as claimed in claim 1, wherein the second insulating feature has a first sidewall facing the first opening, the fourth insulating feature has a first sidewall facing the second opening, and in a plan view, an extending line of the first sidewall of the second insulating feature and an extending line of the first sidewall of the fourth insulating feature are substantially colinear.

8. The method for forming the semiconductor structure as claimed in claim 7, wherein the first sidewall of the second insulating feature and the first sidewall of the fourth insulating feature are substantially aligned over a sidewall of the first fin structure.

9. The method for forming the semiconductor structure as claimed in claim 1, wherein a third dimension of the fifth insulating feature in the first direction is less than the first dimension of the first insulating feature.

10. The method for forming the semiconductor structure as claimed in claim 1, wherein the second insulating feature has a sidewall in direct contact with the first source/drain feature and vertically aligned with a sidewall of the first fin structure.

11. A method for forming a semiconductor structure, comprising:
    forming a first source/drain feature, a second source/drain feature and a third source/drain feature over a first fin structure, wherein the second source/drain feature is located between the first source/drain feature and the third source/drain feature;
    forming a fourth source/drain feature, a fifth source/drain feature and a sixth source/drain feature over a second fin structure, wherein the fifth source/drain feature is located between the fourth source/drain feature and the sixth source/drain feature;
    forming a dielectric material over the first to sixth source/drain features;
    forming a patterned mask layer over the dielectric material,
    wherein the patterned mask layer has a first opening pattern corresponding to the first source/drain feature, a second opening pattern corresponding to the second source/drain feature, a third opening pattern corresponding to the third source/drain feature, a fourth opening pattern corresponding to the fourth source/drain feature, a fifth opening pattern corresponding to the fifth source/drain feature, and a sixth opening pattern corresponding to the sixth source/drain feature, a first distance between the first opening pattern and the fourth opening pattern is less than a second distance between the second opening pattern and the fifth opening pattern, and a third distance between the third opening pattern and the sixth opening pattern is less than the first distance; and etching the dielectric material using the patterned mask layer.

12. The method for forming the semiconductor structure as claimed in claim 11, further comprising:

forming a first gate stack, a second gate stack, a third gate stack and a fourth gate stack across the first fin structure, wherein the first source/drain feature and the fourth source/drain feature are located between the first gate stack and the second gate stack, the second source/drain feature and the fifth source/drain feature are located between the second gate stack and the third gate stack, and the third source/drain feature and the sixth source/drain feature are located between the third gate stack and the fourth gate stack.

13. The method for forming the semiconductor structure as claimed in claim 11, wherein a first dimension of the first opening pattern in a first direction is less than a second dimension of the second opening pattern in the first direction, and a third dimension of the third opening pattern is greater than the first dimension and less than the second dimension.

14. The method for forming the semiconductor structure as claimed in claim 11, wherein a first dimension of the fourth opening pattern in a first direction is less than a second dimension of the fifth opening pattern in the first direction, and a third dimension of the sixth opening pattern is less than the first dimension.

15. The method for forming the semiconductor structure as claimed in claim 11, wherein the dielectric material is etched using the patterned mask layer to form a first contact opening exposing the first source/drain feature, a second contact opening exposing the second source/drain feature, a third contact opening exposing the third source/drain feature, a fourth contact opening exposing the fourth source/drain feature, a fifth contact opening exposing the fifth source/drain feature, and a sixth contact opening exposing the sixth source/drain feature.

16. A semiconductor structure, comprising:
a first source/drain feature and a second source/drain feature over a first fin structure;
a third source/drain feature and a fourth source/drain feature over a second fin structure;
a first contact plug, a second contact plug, a third contact plug and a fourth contact plug on the first source/drain feature, the second source/drain feature, the third first source/drain feature and the fourth source/drain feature, respectively, wherein in a plan view the second contact plug is longer than the third contact plug, and the third contact plug is longer than the fourth contact plug; and
a first insulating feature sandwiched between the first contact plug and the third contact plug; and
a second insulating feature sandwiched between the second contact plug and the fourth contact plug, wherein in a plan view, the first insulating feature is longer than the second insulating feature.

17. The semiconductor structure as claimed in claim 16, wherein in a plan view, the first contact plug is shorter than the second contact plug.

18. The semiconductor structure as claimed in claim 16, wherein the first insulating feature is interfaced with the third contact plug at a first boundary, the second insulating feature is interfaced with the second contact plug at a second boundary and interfaced with the fourth contact plug at a third boundary, and in a plan view, a first extending line of the first boundary is located between a second extending line of the second boundary and a third extending line of the third boundary.

19. The semiconductor structure as claimed in claim 17, wherein the first extending line of the first boundary is closer to the third extending line of the third boundary than to the second extending line of the second boundary.

20. The semiconductor structure as claimed in claim 16, further comprising:
a first via over the second contact plug;
a second via over the third contact plug; and
a third via over the fourth contact plug, wherein in a plan view, the first via is located outside an area of the first fin structure, and the second via and the third via are located within an area of the second fin structure.

* * * * *